United States Patent
Manoj Gangadhar et al.

(10) Patent No.: US 10,387,585 B2
(45) Date of Patent: Aug. 20, 2019

(54) SYSTEM AND METHOD FOR PERFORMING MODEL VERIFICATION

(71) Applicant: The MathWorks, Inc., Natick, MA (US)

(72) Inventors: Dixit Manoj Gangadhar, Bangalore (IN); William J. Aldrich, Sudbury, MA (US); Amogh Margoor, Bangalore (IN); Prahladavaradan Sampath, Bangalore (IN)

(73) Assignee: The MathWorks, Inc., Natick, MA (US)

( * ) Notice: Subject to any disclaimer, the term of this patent is extended or adjusted under 35 U.S.C. 154(b) by 583 days.

(21) Appl. No.: 14/584,327

(22) Filed: Dec. 29, 2014

(65) Prior Publication Data

US 2016/0124827 A1 May 5, 2016

(30) Foreign Application Priority Data

Oct. 30, 2014 (IN) .......................... 3108/DEL/2014

(51) Int. Cl.
*G06F 11/30* (2006.01)
*G06F 17/50* (2006.01)
(Continued)

(52) U.S. Cl.
CPC ........ *G06F 17/5009* (2013.01); *G06F 11/263* (2013.01); *G06F 11/36* (2013.01)

(58) Field of Classification Search
CPC .. G01M 99/005; G01M 15/14; G01M 99/008; G01M 7/00; G01M 99/00;
(Continued)

(56) References Cited

U.S. PATENT DOCUMENTS 7,324,931 B1 1/2008 Warlock
7,558,712 B1 7/2009 Aldrich
(Continued)

OTHER PUBLICATIONS

Aldrich, William, "Using Model Coverage Analysis to Improve the Controls Development Process," American Institute of Aeronautics and Astronautics, Aug. 2002, pp. 1-11.
(Continued)

*Primary Examiner* — Toan M Le
*Assistant Examiner* — Xiuqin Sun
(74) *Attorney, Agent, or Firm* — Cesari and McKenna, LLP; Michael R. Reinemann

(57) ABSTRACT

A system and method extends model verification through the creation of composite test objectives. A composite objective includes two or more logically or temporally combined standard or basic test objectives. The basic test objectives selected to form a composite test may be automatically generated by the system or method, or they may be custom defined. A composite test objective represents a new coverage objective that extends model coverage analysis beyond the coverage that is available with the basic test objectives. The system and method also automatically generates one or more test cases for achieving the composite objective. The test cases include input data values for the model, and may cause the specified logical or temporal combination of basic test objectives to evaluate to true at least once during simulation of the model or according to the temporal combination.

33 Claims, 16 Drawing Sheets

(51) Int. Cl.
*G06F 11/263* (2006.01)
*G06F 11/36* (2006.01)

(58) Field of Classification Search
CPC .... G01M 13/00; G01M 13/028; G01M 13/04; G01M 13/045; G01M 11/02; G01M 11/025; G01M 17/10; G01M 1/00; G01M 99/007
USPC ........................................................ 702/182
See application file for complete search history.

(56) References Cited

U.S. PATENT DOCUMENTS

| | | | |
|---|---|---|---|
| 7,680,632 B1 | 3/2010 | Aldrich | |
| 7,729,894 B1 | 6/2010 | Aldrich | |
| 7,941,299 B1 | 5/2011 | Aldrich et al. | |
| 7,950,004 B2* | 5/2011 | Vieira | G06F 11/3688 714/25 |
| 7,974,823 B1 | 7/2011 | Aldrich | |
| 7,991,598 B1 | 8/2011 | Wood | |
| 8,104,017 B2 | 1/2012 | Lin et al. | |
| 8,234,105 B1 | 7/2012 | Aldrich et al. | |
| 8,522,215 B1 | 8/2013 | Aldrich et al. | |
| 8,627,276 B2 | 1/2014 | Lin et al. | |
| 8,745,590 B2* | 6/2014 | Mujeeb | G06F 11/3688 717/124 |
| 8,812,276 B2 | 8/2014 | Aldrich et al. | |
| 8,903,688 B1 | 12/2014 | Aldrich et al. | |
| 2011/0289488 A1* | 11/2011 | Ghosh | G06F 11/3684 717/131 |
| 2011/0295578 A1 | 12/2011 | Aldrich et al. | |
| 2013/0326472 A1 | 12/2013 | Han et al. | |
| 2014/0358506 A1 | 12/2014 | Aldrich et al. | |

OTHER PUBLICATIONS

"Simulink®: User's Guide: R2014a," The MathWorks, Inc., Mar. 2014, pp. 3632.

Lee, John, et al., "Requirements Modeling and Automated Requirements-Based Test Generation," (No. 2013-01-2237), SAE international, Sep. 17, 2013, pp. 1-9.

"Simulink Design Verifier User's Guide-R2012a," The MathWorks, Inc., Mar. 2012, pp. 1-515.

Sridhar, Adepu, et al., "Model-Based Test-Case Generation for Simulink/Stateflow Using Dependency Graph Approach," 2013 $3^{rd}$ IEEE International Advance Computing Conference (IACC), IEEE, Feb. 22-23, 2013, pp. 1415-1420.

Whalen, Michael, et al., "Observable Modified Condition/Decision Coverage," $35^{th}$ International Conference on Software Engineering (ICSE 2013), San Francisco, CA, USA, IEEE, May 18-26, 2013, pp. 102-111.

* cited by examiner

```
function output (in1, in2, in3, in5)
{
    if ( in2 > 0 ) {
        switch_out = in1 ;
    } else {
        switch_out = in3 ;
    } if ( switch_out > 0 ) {
        switch1_out = switch_out ;
    } else {
        switch1_out = in5 ;
    } out1 = switch_out ;
    return (out1) ;
}
```

1300 — (whole listing)
1302 — first if/else block
1304 — second if/else block
1306 — out1 = switch_out ;
1308 — return (out1) ;

FIG. 13

```
function output (in1, in2, in3, in5)                              ─ 1400
{
    %% monitor variables to store control status of switch
blocks %%
    bool __obj_monitor1 = false ;
    bool __obj_monitor2 = false ;     ─ 1402
    bool __obj_monitor3 = false ;
    bool __obj_monitor4 = false ;

%% store the 'decision' status of 'switch' block. %%  ─ 1404
    __obj_monitor1 = ( in2 > 0 ) || ( __obj_monitor1 ) ;
    __obj_monitor2 = !( in2 > 0) || ( __obj_monitor2 ) ;  ─ 1406 if ( in2 > 0 ) {
        switch_out = in1 ;
    } else {                          ─ 1302
        switch_out = in3 ;
    }

%% store the 'decision' status of 'switch1' block. %%  ─ 1408
    __obj_monitor3 = ( switch_out > 0 ) || ( __obj_monitor3 ) ;
    __obj_monitor4 = !( switch_out > 0 ) || ( __obj_monitor4 ) ; ─ 1410 if (switch_out > 0 ) {
        switch1_out = switch_out ;
    } else {                          ─ 1304
        switch1_out = in5 ;
    }

%% composition directives for 'switch' and 'switch1'
blocks. %%
    --satisfy (obj_monitor1 && obj_monitor3) ; ─ 1412
    --satisfy (obj_monitor1 && obj_monitor4) ; ─ 1413
    --satisfy (obj_monitor2 && obj_monitor3) ; ─ 1414
    --satisfy (obj_monitor2 && obj_monitor4) ; ─ 1415 out1 = switch1_out ; ─ 1306
    return (out1) ; ─ 1308
}
```

*FIG. 14*

SYSTEM AND METHOD FOR PERFORMING MODEL VERIFICATION

CROSS-REFERENCE TO RELATED APPLICATIONS

This application claims the benefit of foreign Application No. 3108/DEL/2014 filed Oct. 30, 2014 in India at the Office of the Controller General of Patents, Designs & Trade Marks.

BRIEF DESCRIPTION OF THE DRAWINGS

The invention description below refers to the accompanying drawings, of which:

FIG. 13 is a schematic illustration of pseudo code in accordance with an embodiment; and FIG. 14 is schematic illustration of an instrumented version of the pseudo code of FIG. 13 in accordance with an embodiment.

DETAILED DESCRIPTION OF ILLUSTRATIVE EMBODIMENTS

Background

Figure 1:
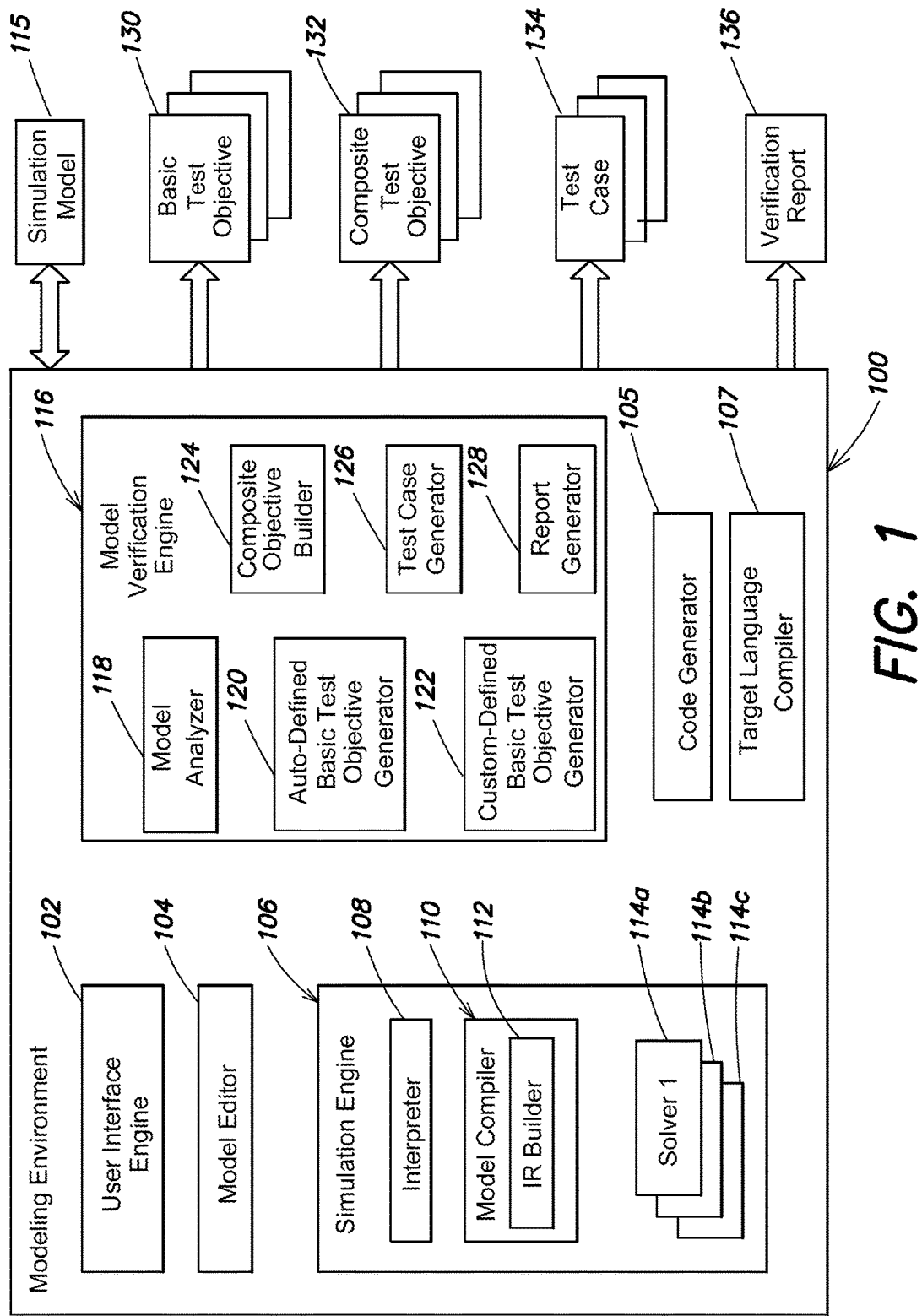
FIG. 1 is a partial, functional diagram of a modeling environment in accordance with an embodiment.

Engineers often use computer-based modeling environments to design systems, such as control systems. For example, an engineer may construct a computer model of the system being designed within the modeling environment. The engineer may execute, e.g., simulate, the model using sample input values, and evaluate whether the model produces the desired behavior. In particular, the engineer may determine whether the model, during simulation, generates expected output values. When the engineer is satisfied that the model accurately simulates the operation of the system being designed, code, such as computer source code, may be generated for the model. The code may be generated manually, automatically, or both. The generated code may be in a form suitable for execution outside of the modeling environment, and may be loaded onto a target computing platform. The target computing platform may be subjected to testing, and if acceptable, the generated code may be utilized to implement production versions of the system being designed.

Before approving a model for use in creating a production version of the system being designed, an engineer may use a verification tool to determine whether one or more design or other errors exist in the model. The verification tool may use formal methods to identify errors in the model. If design or other errors are found, the model may be revised to correct the errors. Exemplary formal methods include automated theorem provers for generating test cases, abstract interpretation for identifying design errors, and temporal-logic model checkers to identify deadlocks, etc. Exemplary design errors include the existence of dead logic, integer overflow, division by zero, violations of design properties and assertions, etc. The model also may be tested in accordance with a model coverage objective. Exemplary model coverage objectives can include: condition coverage, which measures the percentage of the total number of logic conditions associated with logical objects of the model that are exercised; decision coverage, which measures the total number of paths through the model that are traversed; modified condition/decision coverage (MC/DC), which measures the independence of logical block inputs and transition conditions associated with logical objects, etc.

The verification tool may identify a plurality of test objectives based on the selected model coverage objective and the model's structure. Specifically, during simulation, the model may generate intermediate signals and/or data as well as output signals and/or data, and a test objective may be a logical expression of values of one or more intermediate or output signals and/or data that is intended to be true at least once during simulation of the model. A test objective may represent a goal to be achieved during simulation of the model. For example, a test objective may specify a desired model behavior or an undesired model behavior. An undesired model behavior, if present, may indicate an error condition in the model. The verification tool also may generate test cases that achieve the test objectives. A test case may specify particular input data values that may be received by the model during simulation. A test case that is in the form of a vector may be referred to as a test vector. The verification tool also may be configured to generate a counterexample that falsifies a test objective.

In addition to test objectives identified automatically by the verification tool based on the selected model coverage objective and the model's structure, the engineer may specify one or more custom test objectives for the model. For example, there may be a set of requirements that must be met by the system being designed, and the engineer may specify a custom test objective to determine whether the model satisfies one or more of these requirements. In particular, the verification tool may provide specially-designed objects, such as a graphical test objective block, which may be added to the model and configured with a custom test objective. Custom test objectives may also be specified in accordance with a predetermined textual syntax that is recognized and understood by the verification tool. The verification tool also may generate test cases for the custom test objectives.

Overview

In an embodiment, the invention relates to a system and method for expanding model verification by creating a new type of objective, referred to as a composite test objective. A composite objective may include two or more standard or basic test objectives that are logically combined to form a single, composite objective to test for a new failure scenario. The basic test objectives that form a composite test may be generated automatically by the system or method, or they may be custom defined. A composite test objective represents a new coverage objective that extends model coverage analysis beyond that which is available through use of the basic test objectives alone. For example, composite test objectives may evaluate pathways through a model that are not otherwise exercised or examined by basic test objectives. The system and method may also automatically generate one or more test cases for achieving the composite objective. A test case, which may include input data values for the model, may cause the specified logical combination of basic test objectives to evaluate to true at least once during simulation of the model, e.g., during a single time step of the model's execution. Counterexamples that falsify a composite test objective may also be generated.

In an embodiment, the system and method may be configured with one or more predefined compose operations that may be used to specify the logical relationships among selected basic test objectives, thus creating the composite objective. The compose operations may define logical relationships among the selected basic test objectives, such as AND, OR, and NOT. A compose operation may also include one or more temporal operations or constructs, such as FOLLOWS, BEFORE, AFTER, EVENTUALLY, ALWAYS, etc. Additionally or alternatively, one or more graphical affordances, such as user interfaces or graphical model objects, may be provided for specifying a composite objective.

In addition, composite test objectives may be hierarchically arranged or nested. For example, a composite objective may itself include one or more composite objectives, thereby further extending the available coverage analysis. Also, a plurality of composite objectives may be organized into a composite objective specification, and the system and method may generate one or more test cases for satisfying all of the composite objectives included within the composite objective specification.

In an embodiment, composite objectives may be stored as meta data with the model. A composite test objective specification may also be stored with a model.

Modeling Environment

FIG. 1 is a partial, functional diagram of a modeling environment 100 in accordance with an embodiment. The modeling environment 100 may include a plurality of modules or components. For example, the modeling environment 100 may include a User Interface (UI) engine 102, a model editor 104, a simulation engine 106, a code generator 105, a target language compiler 107, and a model verification engine 116.

The UI engine 102 may be configured to create and present one or more User Interfaces (UIs), such as Graphical User Interfaces (GUIs) and/or Command Line Interfaces (CLIs), on the display of a workstation or other data processing device. The GUIs and CLIs may provide a user interface to the modeling environment 100, and may be operated by users to initiate various model-related tasks, such as opening, creating and saving models, such as a simulation model 115. The model editor 104 may be configured to perform the selected operations, such as open, create, edit, and save, in response to the user inputs.

The simulation engine 106 may include an interpreter 108, a model compiler 110 that, in turn, may include one or more Intermediate Representation (IR) builders, such as IR builder 112, and one or more solvers, such as solvers 114*a-c*. The simulation engine 106 may be configured to execute, e.g., compile and run or interpret, computer-generated simulation models, created or opened by the user, using one or more of the solvers 114*a-c*. Exemplary solvers include one or more fixed-step continuous solvers, which may utilize integration techniques based on Euler's Method or Heun's Method, and one or more variable-step solvers, which may be based on the Runge-Kutta and Dormand-Prince pair. A non-exhaustive description of suitable solvers may be found in the *Simulink 7 User's Guide* from The MathWorks, Inc. (March 2014 ed.) The code generator 105 may be configured to generate code for a model automatically, such as source or object code. The generated code may be in form suitable for execution outside of the modeling environment 100. The target language compiler 107 may be configured to compile the generated source code for execution by a target computer platform The model verification engine 116 may include a plurality of components or modules. For example, the model verification engine 116 may include a model analyzer 118, one or more basic test objective generators, such as an auto-defined basic test objective generator 120 and a custom-defined basic test objective generator 122. The model verification engine 116 also may include a composite objective builder 124, a test case generator 126, and a report generator 128. The test objective generators 120 and 122 may construct a plurality of test objectives, designated generally as 130, for the model 115, and the composite objective builder may construct one or more composite test objectives, designated generally as 132, predicated upon the basic test objectives 130. The test case generator 126 may generate a plurality of test cases, generally designated as 134, for the basic test objectives 130 and the composite test objectives 132, and the report generator 128 may create a verification report 136 that includes the verification analysis of the model 115, as performed by the model verification engine 116.

The modeling environment 100 may include other components (not shown), such as a differencing engine for comparing two models and identifying the differences between them, a merge engine for merging two models, etc.

In an embodiment, the model verification engine 116 and/or one or more of the components thereof may be implemented through one or more software modules or libraries containing program instructions pertaining to the methods described herein. The software modules may be stored in a memory, such as a main memory, a persistent memory and/or a computer readable media, of a workstation or other data processing machine or device, and executed by one or more processing elements. Other computer readable media may also be used to store and execute these program instructions, such as non-transitory computer readable media, including optical, magnetic, or magneto-optical media. In another embodiment, the model verification engine 116 and/or one or more of the components thereof may comprise hardware registers and combinational logic configured and arranged to produce sequential logic circuits. In alternative embodiments, various combinations of software and hardware, including firmware, may be utilized to implement the described methods.

In other embodiments, the model verification engine 116 and/or one or more components thereof, may be separate from the modeling environment 100. In such cases, the model verification engine 116 may communicate with the modeling environment 100, e.g., through local or remote procedure calls, an Application Programming Interface (API), or another communication or interface technology.

In an embodiment, the modeling environment 100 is a high-level modeling application program. Suitable high-level modeling application programs include the MATLAB® algorithm development environment and the Simulink® model-based design environment from The MathWorks, Inc. of Natick, Mass., as well as the Simscape physical modeling system and the Stateflow® state chart tool also from The MathWorks, Inc., the MapleSim physical modeling and simulation tool from Waterloo Maple Inc. of Waterloo, Ontario, Canada, the LabVIEW virtual instrument programming system and the NI MatrixX model-based design product from National Instruments Corp. of Austin, Tex., the Visual Engineering Environment (VEE) from Agilent Technologies, Inc. of Santa Clara, Calif., the System Studio model-based signal processing algorithm design and analysis tool from Synopsys, Inc. of Mountain View, Calif., the SPW signal processing algorithm tool from Synopsis, a Unified Modeling Language (UML) system, a Systems Modeling Language (SysML) system, the System Generator system from Xilinx, Inc. of San Jose, Calif., and the graphical modeling systems described in U.S. Pat. No. 7,324,931 for Conversion of Model Components Into References and U.S. Pat. No. 7,991,598 for Method and System for Modeling a Mechanical System. Models created in the high-level modeling environment 100 may contain less implementation detail, and thus operate at a higher level than certain programming languages, such as the C, C++, C#, and SystemC programming languages.

Those skilled in the art will understand that the MATLAB® algorithm development environment is a math-oriented, textual programming environment for digital signal processing (DSP) design, among other uses. The Simulink® model-based design environment is a block diagram based design environment for modeling and simulating dynamic systems, among other uses. The MATLAB® and Simulink® environments provide a number of high-level features that facilitate algorithm development and exploration, and support model-based design, including dynamic typing, array-based operations, data type inferencing, sample time inferencing, and execution order inferencing, among others. A signal may refer to a time varying quantity having one or more values typically at all points in time during model execution. For example, a signal may have a value at each time step during execution of a model.

In another embodiment, a lower level programming language, such as the C, C++, and C# programming languages, among others, may be used to create one or more models.

Models constructed in the modeling environment 100 may include textual models, graphical models, and combinations of graphical and textual models. A given model, when executed, may simulate, e.g., approximate the operation of, a system. Exemplary systems include physical systems, such as weather systems, financial markets, plants, controllers for factory automation, engine control units (ECUs), anti-lock braking systems (ABS), flight controllers, communication systems, etc. Execution of a model by the modeling environment 100 may also be referred to as simulating or running the model.

In an embodiment, during operation of the modeling environment 100, a user interface, such as a Graphical User Interface (GUI), may be created by the UI engine 102 and presented on a display of a data processing device. The GUI may include a plurality of graphical affordances, such as a model canvas in which a visual presentation of one or more models may be displayed, a menu bar, a command bar, and other windows, panes, dialogs, and graphical elements. The command bar may include a plurality of command buttons, including a 'Run' button, for selection by a user of the modeling environment 100. Selection of the 'Run' button may cause the modeling environment 100 to run or execute a model. Alternatively or additionally, the UI engine 102 may present one or more Command Line Interfaces (CLIs) and one or more text-based commands may be entered in the CLI, e.g., by a user, in order to run a model. In response to the user selecting a Run button or entering the run command (or initiating model execution in another manner, such as by means of a keyboard shortcut, a menu selection, programmatically, etc.), the simulation engine 106 may execute the designated model, and may output the results generated by the model during its execution, for example, to the user via a display.

If code is not generated, the model may be executed in an interpretive mode by the interpreter 108 in which the compiled and linked version of the model may be directly utilized to execute the model over the desired time-span.

During the simulation loop stage, the compiled and linked version of the model may be directly utilized by the simulation engine 106 to execute the model in an interpreted mode.

Model execution may be carried out for one or more model inputs, such as a set of model inputs, and may produce one or more model results or outputs, such as a set of model outputs. Model execution may take place over a time-span. For example, execution may begin at a start time, include one or more time steps, and end at a stop time. The start time, time steps, and end time may be logical and have no correspondence with the physical passage of time. Alternatively, the start time, time steps, and end time may have a correspondence with the physical passage of time and execution may operate in real time. The selection of the time steps may be determined by the selected solver 114.

Creating Composite Test Objectives

Figure 2A:
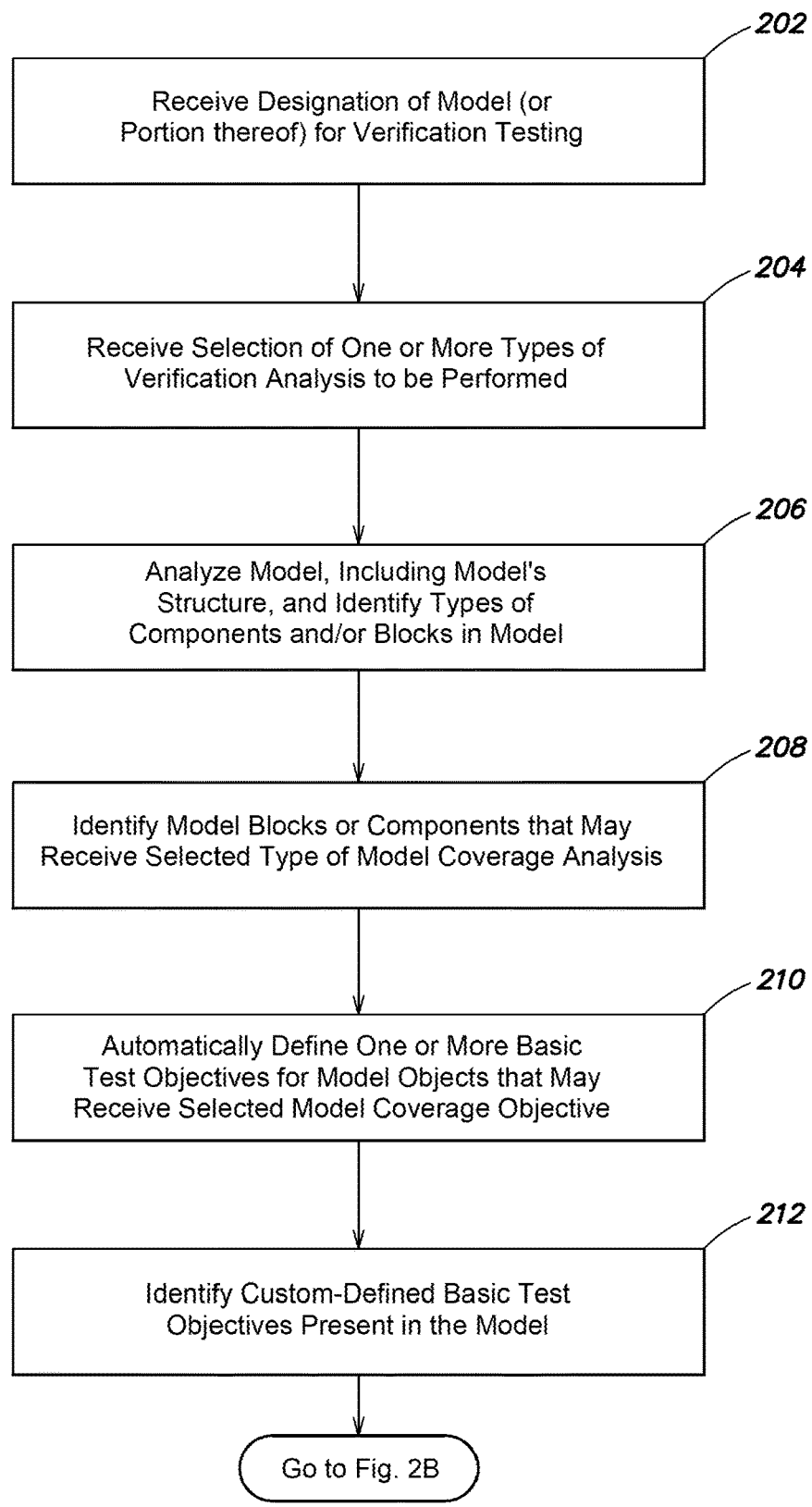
FIGS. 2A-C are partial views of a flow diagram of a method in accordance with an embodiment.
Figure 2B:
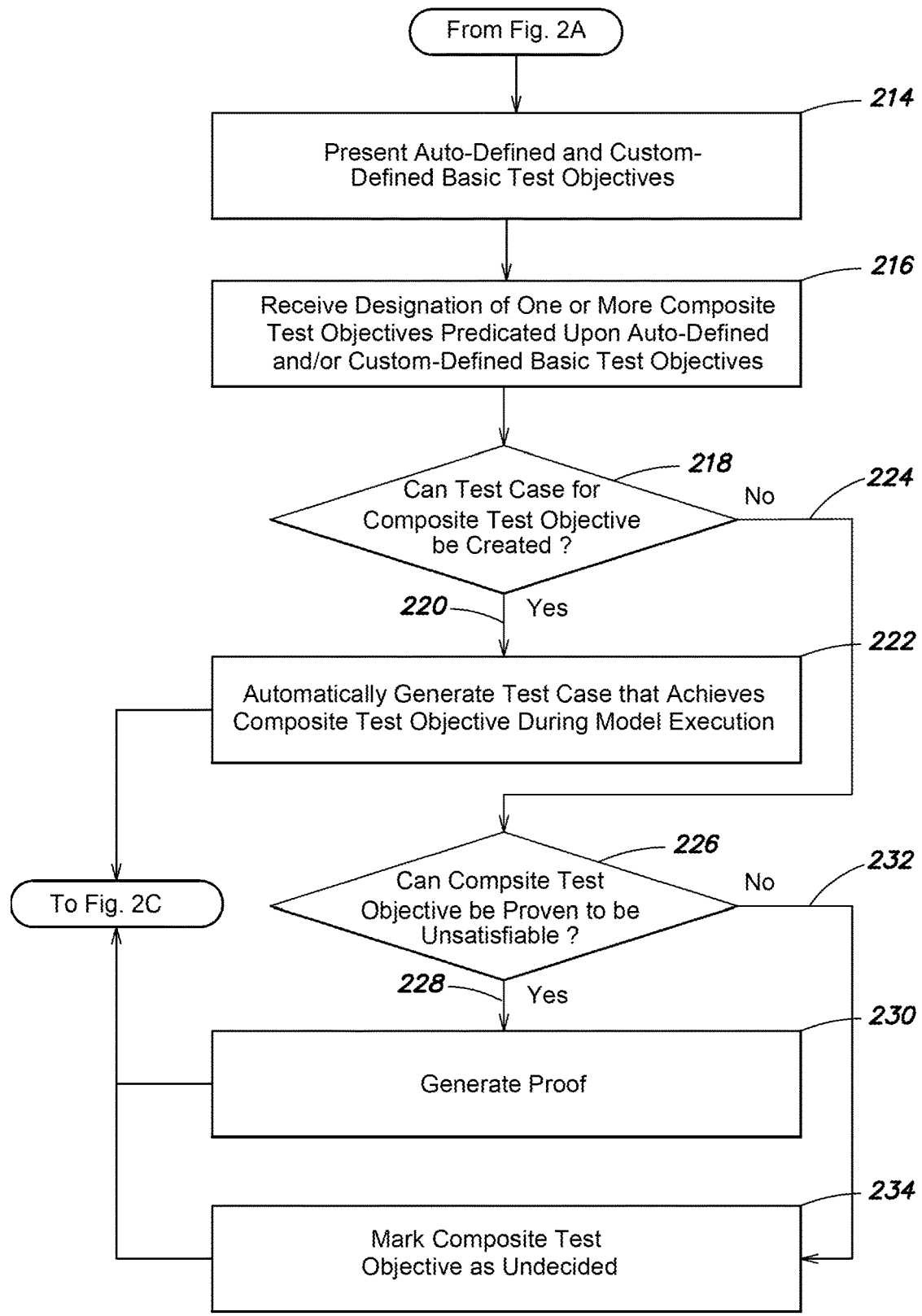
Figure 2C:
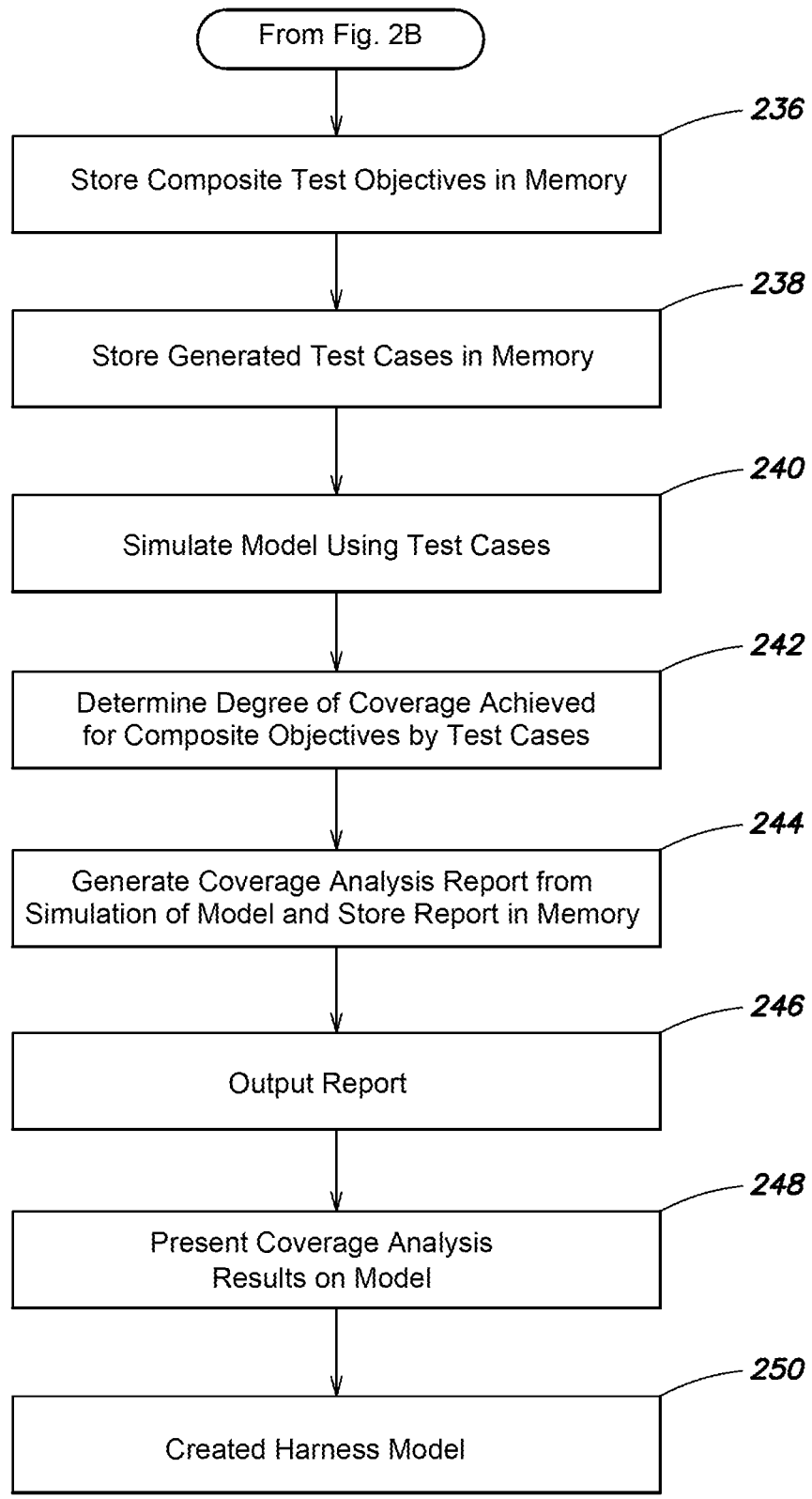

FIGS. 2A-C are partial views of a flow diagram of a method in accordance with an embodiment.

The modeling environment 100 may receive a model, for example in response to a user opening, creating, or revising a model or a portion thereof, as indicated at block 202. The model verification engine 116 may receive a type or mode of verification analysis to be performed on the model, as indicated at block 204. Exemplary modes of model verification include test generation, property proving, and design error detection. In design error detection, the model verification engine 116 may check a model automatically for the existence of design errors, such as dead logic, integer or fixed-point data overflow, division by zero, intermediate signal values that are outside of specified minimums and maximums, and out of bound array or matrix access. In property proving, the model verification engine 116 may perform a formal analysis of the model to prove or disprove specified properties of the model, which may relate to model requirements.

In test generation, the model verification engine 116 may be configured to generate one or more test cases based on a selected model coverage objective, or on functional requirements of the model. Test cases may be data structures, such as vectors, arrays, etc., having values that may be provided as inputs to the model during a simulation of the model. The input values included in a test case may be derived to exercise the functionality of the model's structure in a particular manner. The tests cases also may include values for model-level and/or block-level parameters. The model verification engine 116 may be configured to generate test cases that achieve a desired model coverage objective, which may also be referred to as a coverage metric. In an embodiment, the model verification engine 116 is configured to generate test cases for at least the following model coverage objectives or metrics:

Decision—in which the test cases analyze elements of the model that represent decision points, such as a Switch block or states of a state-based portion of the model;

Condition—in which the test cases analyze model objects that output the logical combination of their inputs, such as a Logical Operator block, and the transitions of a state-based portion of the model;

Modified Condition/Decision Coverage (MCDC)—in which the test cases extend the Decision and Condition coverage capabilities by analyzing model blocks that output the logical combination of their inputs and state-based transitions to determine the extent to which the test case tests the independence of logical block inputs and transition conditions;

Lookup Table—in which the test cases examine blocks of the model that output information from a table or other data structure based on received inputs, such as an n-dimension (n-D) Lookup Table block, and may record the frequency that table lookups use interpolation and/or extrapolation intervals;

Signal Range—in which the test cases record the minimum and maximum signal values, as measured during simulation of the model;

Signal Size—in which the tests cases record the minimum, maximum, and allocated size for all variable-size signals in a model; and Cyclomatic complexity—in which the test cases measure the structural complexity of the model using an approximation of the McCabe complexity measure for code generated from a model.

It should be understood that the model verification engine 116 may be configured to generate test cases for additional model coverage objectives.

In addition to receiving a type of model coverage to be performed, the model verification engine 116 may receive a designation of one or more settable options for use during the generation of test cases.

Figure 3:
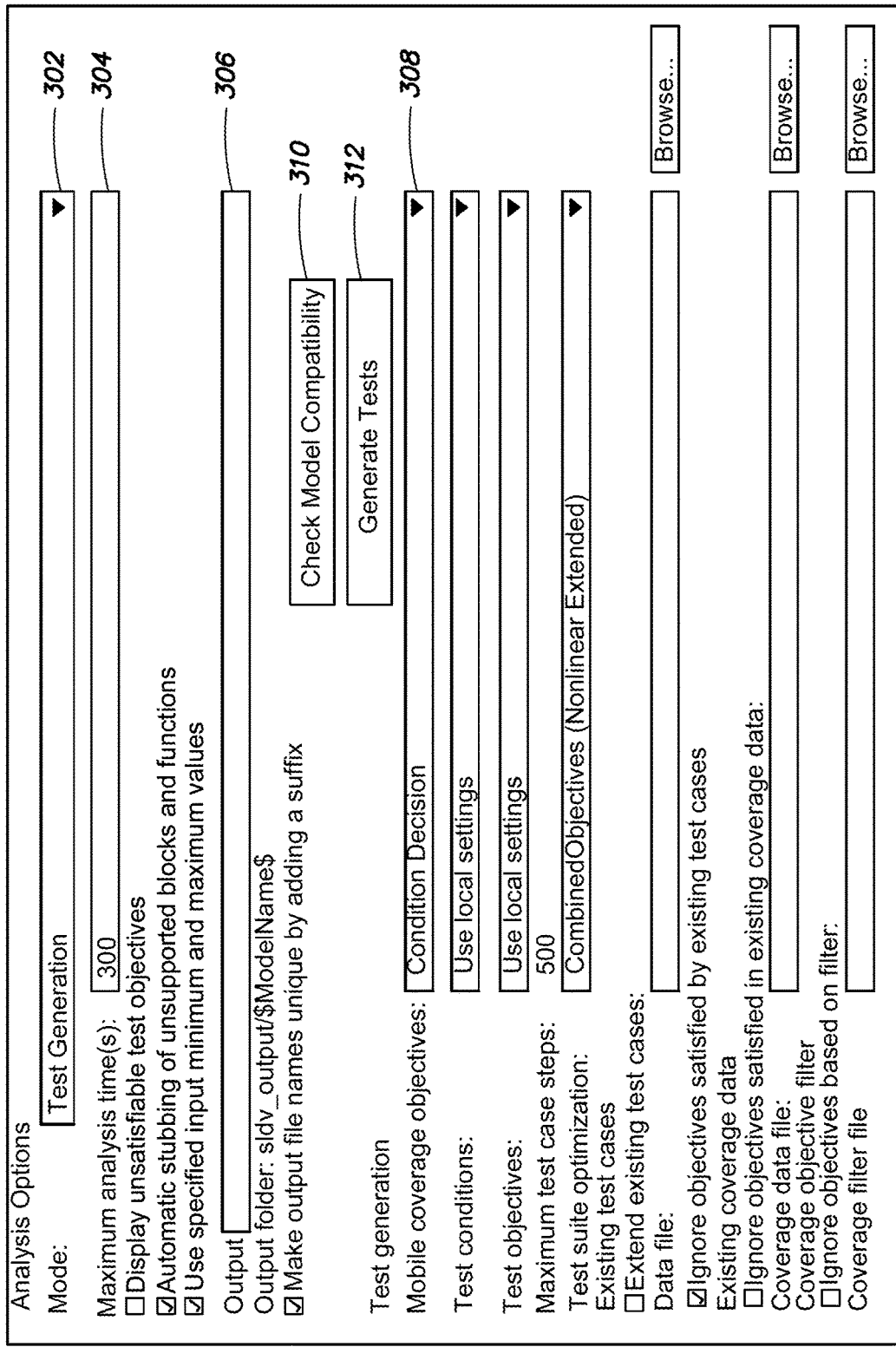
FIG. 3 is a schematic illustration of a user interface in accordance with an embodiment.
Figure 4:
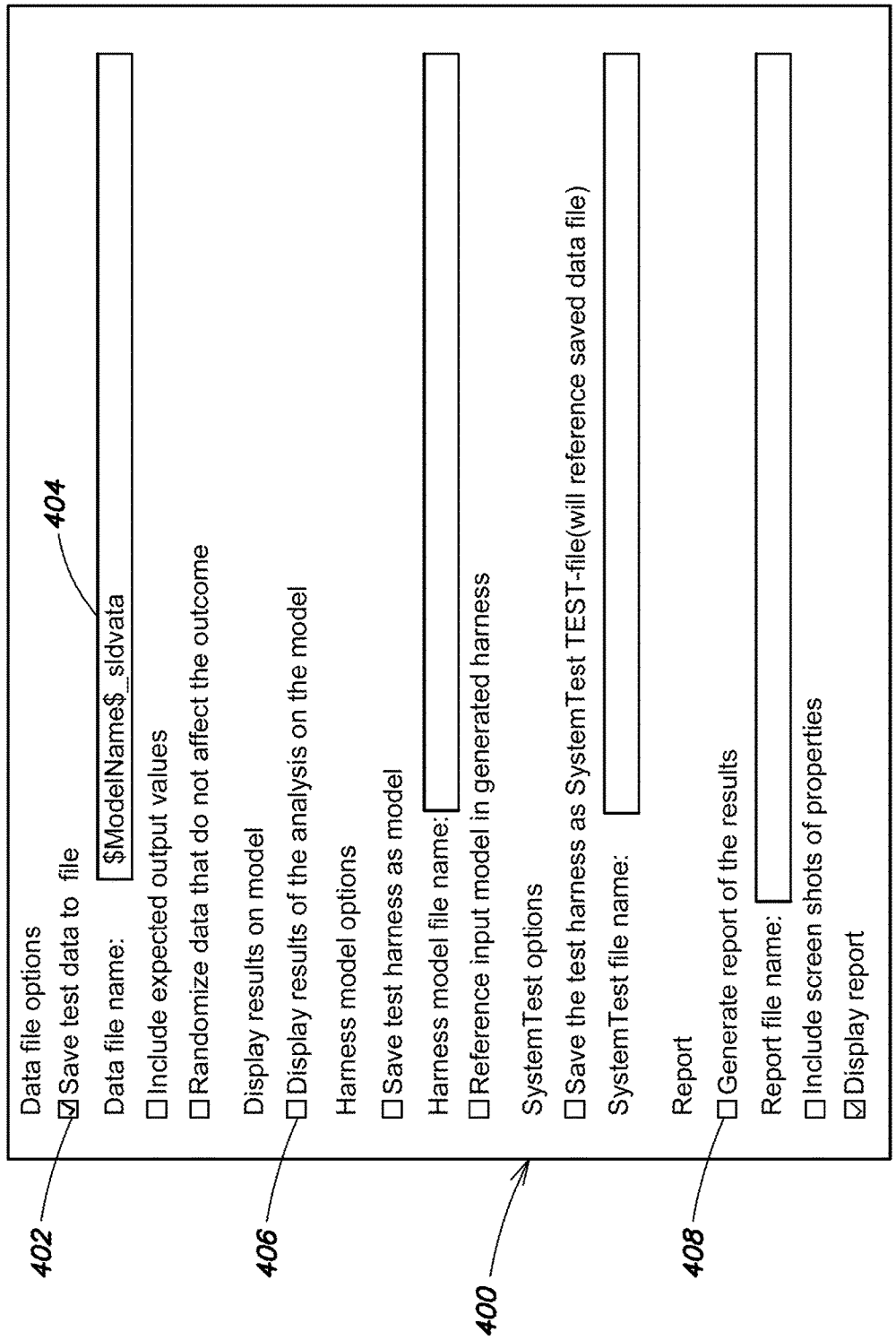
FIG. 4 is a schematic illustration of a user interface in accordance with an embodiment.

The selection of a type of model coverage objective and the setting of one or more options may be made by a user. In an embodiment, the UI engine 102 may present a user interface through which a user may select the desired type of model coverage objective, and may specify values for one or more settable options. FIGS. 3 and 4 are examples of such user interfaces.

In particular, FIG. 3 is a schematic illustration of a first dialog 300 for selecting a type of model coverage objective, and FIG. 4 is a schematic of a second dialog 400 for specifying options. The dialogs 300 and 400 may be presented on a display. The first and second dialogs 300 and 400 may include a plurality of graphical affordances, such as drop down menus, check boxes, radio buttons, alphanumeric entry boxes, etc. A user may interact with the first and second dialogs 300 and 400 to select a desired type of model coverage objective, and to set values for one or more verification options. Specifically, the first dialog 300 may include a mode drop down menu 302 that may be used to select a type of model analysis, such as test generation. The first dialog 300 also may include a maximum analysis time data entry box 304 through which a user may specify how long the model verification engine 116 should spend analyzing the model and attempting to create test cases, e.g., 300 seconds.

The first dialog 300 may include an output folder data entry box 306 through which a user may specify the path of a folder into which data output by the model verification engine 116 should be stored. The first dialog 300 may further include a model coverage objective drop down menu 308 through which a user may specify the desired type of model coverage, e.g., Condition Decision, which directs the model verification engine 116 to generates test cases that achieve Condition and Decision coverage. The first dialog 300 also may include one or more command buttons, such as a Check Model Compatibility command 310 and a Generate Tests command 312. Selection of the Check Model Compatibility command 310 may cause the model verification engine 116 to analyze the model and determine whether it is compatible with the selected type of model coverage objective, or which portions of the model are compatible.

Referring now to FIG. 4, the second dialog 400 may include a plurality of checkboxes for specifying settable options. For example, a Save test data to file checkbox 402 and a Data file name data entry box 404 may be used to direct the model verification engine 116 to save test data, and the name of the file into which such test data is to be saved. The second dialog 400 also may include a Display results of the analysis on the model checkbox 406, which if selected causes the model verification engine 116 to apply one or more graphical affordances to the model, such as coloring, highlighting, etc., to indicate the results of the coverage testing. The second dialog 400 may include a Generate report of the results checkbox 408 that, if selected, causes the report generator 128 to generate a report.

Returning now to FIG. 2A, based on the selected type of model coverage objective, the model analyzer 118 may analyze the model including its structure, as indicated at block 206. For example, the model analyzer 118 may identify the type and location of objects within the model, and may identify those model objects for which test cases can be generated for the selected model coverage objective or coverage metric. Certain model objects may receive any type of model coverage objective, while other model objects may only receive certain types of model coverage objectives. In addition, there may be some model objects supported by the modeling environment 100 that do not receive any type of model coverage objective. The model analyzer 118 may identify those blocks or objects of the model that may receive the designated model coverage objective, as indicated at block 208.

A model's structure may include a plurality of pathways. For example, the pathways may be data pathways that extend from model inputs to model outputs, such as signal pathways. The pathways may also be control pathways, state transition pathways, event pathways, or other pathways. Model coverage is a measure of how thoroughly a test case tests a model, and the percentage of pathways that a test case exercises.

For example, an Absolute (Abs) object, which outputs the absolute value of its input, may receive Decision coverage, which may measure the number of time steps that the input to the Abs block is less than zero, indicating a true decision, and the number of time steps that the input is not less than zero, indicating a false decision. If, during execution of a model with an Abs block, there is at least one time step indicating a true decision and at least one time step indicating a false decision, then Decision coverage is 100%.

A Logical Operator object, which may perform a specified logical operation, such as AND, OR, NAND, NOR, XOR, etc., on its input, may receive Condition and MCDC coverage. The Condition coverage may measure the number of time steps at which each input to the Logical Operator block is true, and the number of time steps at which each input is false. If all inputs are true for at least one time step, and all inputs are false for at least one time step, then condition coverage is 100%. A Switch object, which chooses between outputting a first or third input based on the value of a second (control) input, may receive Decision coverage, which may measure the number of time steps that the control input evaluates to true, and the number of time steps that the control input evaluates to false. If the control input evaluates to true for at least one time step, and to false for at least one time step, Decision coverage is 100%.

For those model objects for which test cases can be generated, the auto-generated basic test objective generator 120 may generate or define one or more basic test objectives, which may be referred to as auto-generated or implicit basic test objectives, as indicated at block 210. A basic test objective may specify a logical expression of a signal or data value within a model that is intended to be true at least once during simulation of the model. The basic test objective may be associated with a block, signal, state, state transition, or other component or element of the model.

For a Switch block, the auto-defined basic test objective generator 120 may identify a first basic test objective in which the control input evaluates to true, and a second basic test objective in which the control input evaluates to false.

The model may also include one or more custom-defined basic test objectives, and the model analyzer 118 may be configured to identify them, as indicated at block 212. In particular, the model analyzer 118 may identify the location and the settings or options associated with custom-defined basic test objectives included in the model. The one or more custom basic test objectives may be user specified. A custom basic test objective may be defined for a signal connecting two or more blocks of a model, for a function embedded in a model, such as a function defined in a textual code block, such as the MATLAB Function block, for transition or state actions defined in a state chart, etc.

For example, the modeling environment 100 may include a library containing a plurality of verification block types. A user may select one or more of the verification block types from the library, and add an instance of that block type to a model. The user may then configure the verification block to specify the intended value, thereby defining a respective test objective. Exemplary model object types include the Objective and the Constraint object types of the Simulink Design Verifier product from The MathWorks. A user may add an instance of the Objective block to the model, and may configure the Objective block to define a custom basic test objective for the model. Similarly, a user may add an instance of the Constraint block to the model, and may configure the Constraint block to specify a constraint on a signal or parameter of the model. During the verification process, the signal or parameter is assigned the specified constraint value.

The model analyzer 118 may perform its analysis on one or more in-memory representations of the model, such as an Intermediate Representation (IR) of the model. For example, the IR builder 112 of the simulation engine may construct an IR of the model, such as a Control Flow Graph (CFG), a Data Flow Graph (DFG), a Control/Data Flow Graph (CDFG), or another form of IR. The IR may be stored in main memory, and may include nodes that represent the objects, e.g., blocks, of the model, and edges that represent signals, events, state transitions, physical relationships, or other dependencies.

The UI engine 102 may present the auto-defined and custom-defined basic test objectives, as indicated at block 214 (FIG. 2B). In particular, the UI engine 102 may generate a graphical affordance, such as a table or dialog, containing a list of at least some of the basic test objectives identified by the model verification engine 116 and of at least some of the custom basic test objectives included in the model. The model verification engine may thus ascertain, e.g., receive, derive, determine, identify, etc., one or more basic test objectives for the model. For example, a test criteria may be specified, and the auto-defined basic test objective generator may derive one or more basic test objectives based on the specified test criteria.

The model verification engine 116 may receive a designation of one or more composite test objectives, as indicated at block 216. A composite test objective may include two or more basic test objectives and one or more logical operators. It may also is include one or more temporal constructs. The two or more basic test objectives may be auto-generated, custom-defined, or a combination of auto-generated and custom-defined. A composite test objective is thus predicated upon two or more basic test objectives.

A composite objective may be specified by a user through textual, graphical, or a combination of textual and graphical inputs. For example, the user may select the basic test objectives with which to form the composite test objective through the graphical affordance presented by the UI engine 102.

Next, the model verification engine 116 may determine whether it can construct a test case to achieve the one or more composite test objectives, as indicated by decision block 218.

A test case may specify input data for the model that results in the composite test objective being satisfied at a time step. A test may also include parameter settings and initialization data for the model. For example, if the composite test objective includes two basic test objectives associated with an AND operation, then the test case may include input data that causes both basic test objectives to be true during a single time step. If it is possible to construct such a test case, the model verification engine 116 may construct the test case, as indicated by Yes arrow 220 leading to block 222. For a composite test objective having two basic test objectives and an AND operation, the test case generator 126 may generate a sequence of inputs, and check whether both basic test objectives are true at one or more time steps during model execution. In an embodiment, the sequence of inputs may satisfy both basic test objectives at the same model step, time, or sample time (depending on the model semantics). To the extent a composite test objective includes a temporal operation, then the test case may satisfy the basic test objectives according to the specified temporal operation, for example a first basic test objective is satisfied BEFORE (or AFTER) a second basic test objective, etc.

The inputs that result in the true condition for both basic test objectives may be the test case. Some or all of the input sequences may be randomly generated. Alternatively, the test case generator 126 may construct a mathematical representation of the model by defining a plurality of symbolic (model) path constraints in terms of model input variables. To define a test case for the given composite test objective, the test case generator 126 may solve a sequence of such constraints, one for each time step, so that both the basic test objectives in the given composite test objective are true at some time step. The test case generator 126 may employ a Directed Automated Random Testing (DART) technique for computing the sequence of constraints. It should be understood that other approaches may be employed.

If the model verification engine 116 cannot construct a test case for the composite test objective, it may determine whether it can prove that the composite test objective cannot be satisfied, as indicated by No arrow 224 leading to decision block 226.

If the test case generator 126 can prove that the composite test objective cannot be satisfied, it may generate the proof, as indicated by Yes arrow 228 leading to block 230. If the test case generator can neither generate a test case nor prove that a composite objective cannot be satisfied, it may designate the composite test objective as undecided, as indicated by No arrow 232 leading to block 234. In an embodiment, an undecided composite test objective may be a composite test objective that could neither be satisfied nor falsified by the test case generator 126. That is, if a composite test objective for which the test case generator 126 is unable to either prove that the composite test objective was satisfied (by generating a test case for the composite test objective), or disprove (by exhaustively testing or mathematically reasoning that the composite test objective cannot be satisfied). The test case generator 126 may also mark a composite test objective as undecided if it is unable to complete its analysis in the time allotted for the model verification process.

Test cases also may be manually created, e.g., by a test engineer. In addition, a test case automatically generated by the test case generator 126 may be modified or revised, e.g., by a test engineer.

The composite objective builder 124 may save the composite test objectives, as indicated at block 236 (FIG. 2C), and the test case generator may save the test cases, as indicated at block 238. The composite test objectives and test cases may be saved in files, objects, or other data structures associated with the model, such as in a project or container for the model.

The simulation engine 106 may execute the model using the test cases generated for the composite test objectives, as indicated at block 240. Execution of a model may take place through a plurality of stages or phases, such as a compile stage, a link stage, and a simulation loop stage. The compile and link stages may be performed by the model compiler 110 of the simulation engine 106. The compile stage may involve preparing data structures and evaluating parameters of the model to determine their values, determining connectivity among components, such as blocks, of the model, configuring and propagating block characteristics (e.g., sample times, data types, etc.), checking model component and block signal compatibility, flattening the model hierarchy, performing optimizations, such as block reduction and block insertion, and determining a sorted order of the blocks or the equations corresponding to the blocks of the model. The simulation engine 106 may also establish other execution schedules, such as state-based, event-based, and/or message-based execution schedules.

During the compile and/or link phases, one or more in-memory representations, such as intermediate representations (IRs), of the model may be generated, e.g., by the IR builder 112. The IRs may be implemented as graphs, such as a data, control, call or data/control/call flow graphs, that include a plurality of nodes and edges. The nodes of the IR may represent the blocks and other components or objects of the model, and the edges may represent connections, such as signals, state transitions, messages, events, defined within the model. Special nodes, called network instance components (NICs), may be used to provide hierarchy in the IR by abstractly representing subsystems or other virtual blocks of the model. The IR may include a plurality of hierarchically arranged levels. For example, there may be a top-level of IR and one or more of the components of the top-level IR may be a particular type or form of in-memory representation. For example, one or more components of the IR may be a Control Flow Graph (CFG), Data Flow Graph (DFG), Control Data Flow Graph (CDFG), program structure tree (PST), abstract syntax tree (AST), a netlist, etc. A CDFG may capture the control flow as well as the data flow of the model through data dependency and control dependency edges. The model compiler 110 may apply one or more optimization techniques to an IR resulting in the creation of additional IRs. The in-memory representations or IRs may be stored in memory, such as main memory, of a data processing device.

Following the compilation and link phases, code may be generated automatically for the model by the code generator 105. The generated code may be textual code, such as textual source code, that may be compiled into object code and executed on a target machine, such as an embedded hardware element of a real-world device, such as a controller. The generated code may conform to one or more programming languages, such as Ada, Basic, C, C++, C#, SystemC, FORTRAN, embedded MATLAB, etc.; it may conform to a description language, such as VHDL, Verilog, a netlist, a Register Transfer Level (RTL) description, a vendor or target specific HDL code format, such as Xilinx FPGA libraries, etc.; or it may conform to assembly code. Alternatively or additionally, the generated code may be in the form of object code or machine instructions, such as an executable, suitable for execution by a target device, such as a central processing unit, a microprocessor, a digital signal processor (DSP), etc.

If code is generated, then subsequent model execution stages may use the generated code during execution of the model.

The target language compiler 107 may compile the code generated for the model, and this generated code may be deployed outside of the modeling environment 100. For example, the generated and compiled code may be deployed and run on embedded hardware or another data processing device that does not include the modeling environment 100 and/or the simulation engine 106.

A code generation command may be invoked by user input or programmatically, for example, when a particular event occurs, such as a model passing verification, etc.

During simulation of the model, the model verification engine 116 may determine the degree of model coverage achieved by the test cases, as indicated at block 242. For example, coverage may be full or partial. The report generator 128 may generate a report containing the results of the coverage analysis of the model, as indicated at block 244. The report may be output to a device, as indicated at block 246. For example, the report may be presented on a display screen of a data processing device, printed, saved to memory, etc. In addition, the model verification engine 116 may present the results of the model coverage analysis in the model itself, for example, by color coding model objects, as indicated at block 248. The model verification engine 116 may also generate a harness model that includes a component representing the model, and further includes one or more source blocks for providing the test cases to the component representing the model, as indicated at block 250.

Exemplary Models

The model verification engine 116 may be configured to receive the designation of a composite test objective in different ways. In an embodiment, a user may specify the one or more composite test objectives from within the model. For example, to specify a test objective that combines the predicate test objectives defined for two blocks of the model, the user may select the two blocks, and chose a 'Construct Composite Objective' command. The 'Construct Composite Objective' command may be accessed from a toolbar menu, e.g., Tools→Model Verification→Construct Composite Objective.

Figure 5:
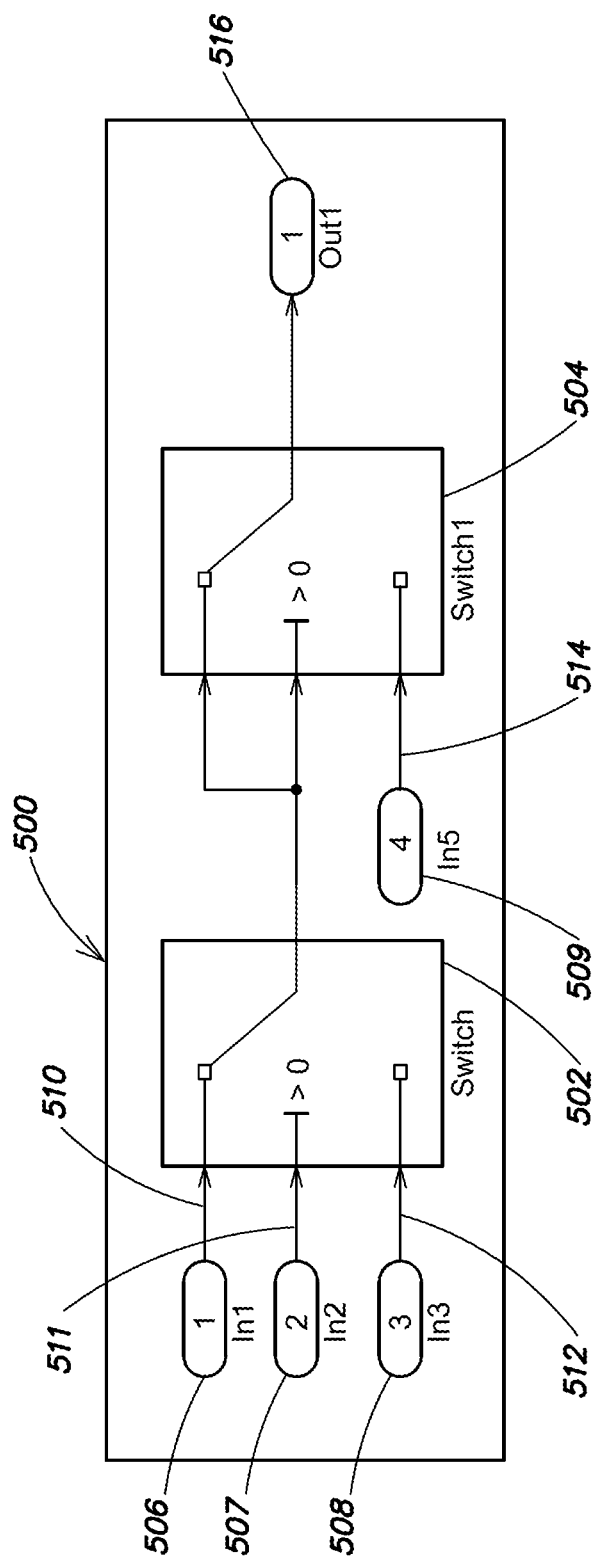
FIG. 5 is a schematic illustration of a model in accordance with an embodiment.

FIG. 5 is a schematic illustration of a first model 500. The first model 500 is a graphical executable model in block diagram form, and includes a first switch block (Switch) 502 and a second switch block (Switch1) 504. The first model 500 further includes first, second, third, and fourth Inport blocks 506-509. As indicated by arrows 510-512, the first, second, and third Inport blocks 506-508, provide input values to the first, second, and third inputs of the first switch block 502. The fourth Inport block 509 provides input values to the third input of the second switch block 504, as indicated by arrow 514. The output of the first switch block 502 is provided to the first and second inputs of the second switch 504, and the output of the second switch block 504 is received by an Outport block 516 of the first model 500.

If the Decision type of model coverage objective is selected for the first model 500, the auto-defined basic test objective generator 120 may define two basic test objectives for the first switch block 502, and two basic test objectives for the second switch block 504. In particular, the auto-defined basic test objective generator 120 may define the following basic test objectives:

1. a first basic test objective where the control input to the first switch block 502 is true at a given time step;
2. a second basic test objective where the control input to the first switch block 502 is false at a given time step;
3. a third basic test objective where the control input to the second switch block 504 is true at a given time step; and
4. a fourth basic test objective where the control input to the second switch block 504 is false at a given time step.

A user may also specify a desired composite test objective by selecting other model objects, such as a block and a state of a state chart, two states, a block and a state transition, a state and a state transition, two state transitions, a custom-defined test objective object, such as an Objective block and another model object or element, etc.

In an embodiment, a user may specify one or more composite test objectives through one or more textual statements. For example, the model verification engine 116 may define or otherwise support a command syntax that can be used to specify the one or more composite test objectives. The user may enter one or more textual statements that conform to this command syntax to define the desired composite test objectives. The one or more textual statements may be stored in a file or other object associated with the model. When the model is run, the file may be accessed, and the model verification engine 116 may attempt to construct test cases for the composite test objectives specified in the file. For example, the user may enter the textual command:

compose(Switch, Switch1), where

'compose' is the name of a function that constructs a composite test objective, and 'Switch' and 'Switch1' are the names of model elements, such as blocks, that are the input arguments to the 'compose' operation.

The textual command may be entered in a CLI presented by the UI engine 102, and saved in a configuration or other file associated with the first model 500.

In response to the user's input to create a composite test objective predicated upon the two switch blocks 502 and 504, the composite objective builder 124 may construct one or more composite test objectives. In particular, the composite objective builder 124 may create a plurality of composite test objectives based that are logical combinations of the basic test objectives defined for the first and second switch blocks 502 and 504. More specifically, the composite objective builder 124 may construct the following composite test objectives:

1. a first composite test objective where the control input to the first switch block 502 is true and the control input to the second switch block 504 is true at a given time step;
2. a second composite test objective where the control input to the first switch block 502 is true and the control input to the second switch block 504 is false at a given time step;
3. a third composite test objective where the control input to the first switch block 502 is false and the control input to the second switch block 504 is true at a given time step; and
4. a fourth composite test objective where the control input to the first switch block 502 is false and the control input to the second switch block 504 is false at a given time step.

It should be understood that other statements may be used to define composite test objectives. For example, a user may define a composite test objective as follows:

compose({switch1, Decision, true}, {switch2, Decision, false})

where

'switch1, Decision, true' identifies the basic test objective generated by the Decision model coverage objective or metric when the control for the switch1 block is true, and switch2, Decision false' identifies the basic test objective generated by the Decision model coverage objective or metric when the control for the switch2 block is false.

The composite test objective is a single test objective in which these two basic test objectives are satisfied.

The test case generator 126 may attempt to create one or more test cases for each of the above-identified composite test objectives. Test cases designed for composite test cases may test model pathways that would not otherwise be tested by test cases constructed for individual basic test objectives.

In an embodiment, the model verification engine 116 may be configured to instrument a model or a portion thereof in order to create the one or more test cases for a composite test objective. FIG. 13 is a pseudo code representation 1300 of the first model 500. The pseudo code 1300 includes a first portion 1302 that corresponds to the first switch block (Switch) 502. The first portion 1302, which is written in an If-Else format, determines whether the control signal (in2) at the first switch block (Switch) 502 is greater than zero. If so, a first variable corresponding to the switch's output, 'switch_out', is set to the signal at the first Inport block (in1) 506. Otherwise, the first variable is set to the signal at the third Inport block (in3) 508. The pseudo code 1300 further includes a second portion 1304 that corresponds to the second switch block (Switch1) 504. The second portion 1304 is also written in If-Else format, and determines whether the control signal, 'switch_out', at the second switch block (Switch1) 504 is greater than zero. If so, a second variable corresponding to the second switch's output, 'switch1_out, is set to the output from the first switch, 'switch_out'. Otherwise, it is set to the signal at the fourth Inport block (in5) 509. The pseudo code 1300 includes a first entry 1306 that sets a third variable, 'out1', corresponding to the output of the first model 500 to the second variable, 'switch1_out'. Finally, the pseudo code 1300 includes a second entry 1308 that returns third variable, 'out1'.

FIG. 14 is a representation of instrumented pseudo code 1400 for the first model 500. The instrumented pseudo code 1400 includes a first portion 1402 that declares four variables, identified as 'monitor' variables, and initializes them to False. The instrumented pseudo code 1400 includes first and second statements 1404 and 1406 that assign the Decision model coverage objective or metric for the first switch block (Switch) 502 to the first and second 'monitor' variables. More specifically, using a logical OR operation (||), the first statement 1404 sets the first monitor variable, 'monitor1', to True when the control signal (in2) at the first switch block (Switch) 502 is greater than zero. Using the logical NOT (!) and OR (||) operations, the second statement 1406 sets the second monitor variable, 'monitor2', to True when the control signal (in2) is less than or equal to zero. In a similar manner, third and fourth statements 1408 and 1410 assign the Decision model coverage objective or metric for the second switch block (Switch1) 504 is to the third and fourth 'monitor' variables, 'monitor3' and 'monitor4'.

The instrumented pseudo code 1400 also includes fifth through eighth statements 1412-1415 for creating the test cases for the composite test objective predicated upon the first and second switches 502 and 504. The 'satisfy' function of the fifth through eighth statements 1412-1415 direct the test case generator 126 to generate a test case that satisfies the arguments specified in the respective 'satisfy' function. The arguments of the 'satisfy' functions set forth in the fifth through eighth statements 1412-1415 are the various combinations of basic test objectives for the first and second switch blocks 502 and 504. In particular:

The fifth statement 1412 directs the test case generator 126 to create a test case where the control input to the first switch block 502 is true and the control input to the second switch block 504 is true at a given time step. The sixth statement 1413 directs the test case generator 126 to create a test case where the control input to the first switch block 502 is true and the control input to the second switch block 504 is false at a given time step. The seventh statement 1414 directs the test case generator 126 to create a test case where the control input to the first switch block 502 is false and the control input to the second switch block 504 is true at a given time step. The eighth statement 1415 directs the test case generator 126 to create a test case where the control input to the first switch block 502 is false and the control input to the second switch block 504 is false at a given time step.

It should be understood that instrumented code having monitor variables may be used to create test cases for other composite test objectives.

Figure 6:
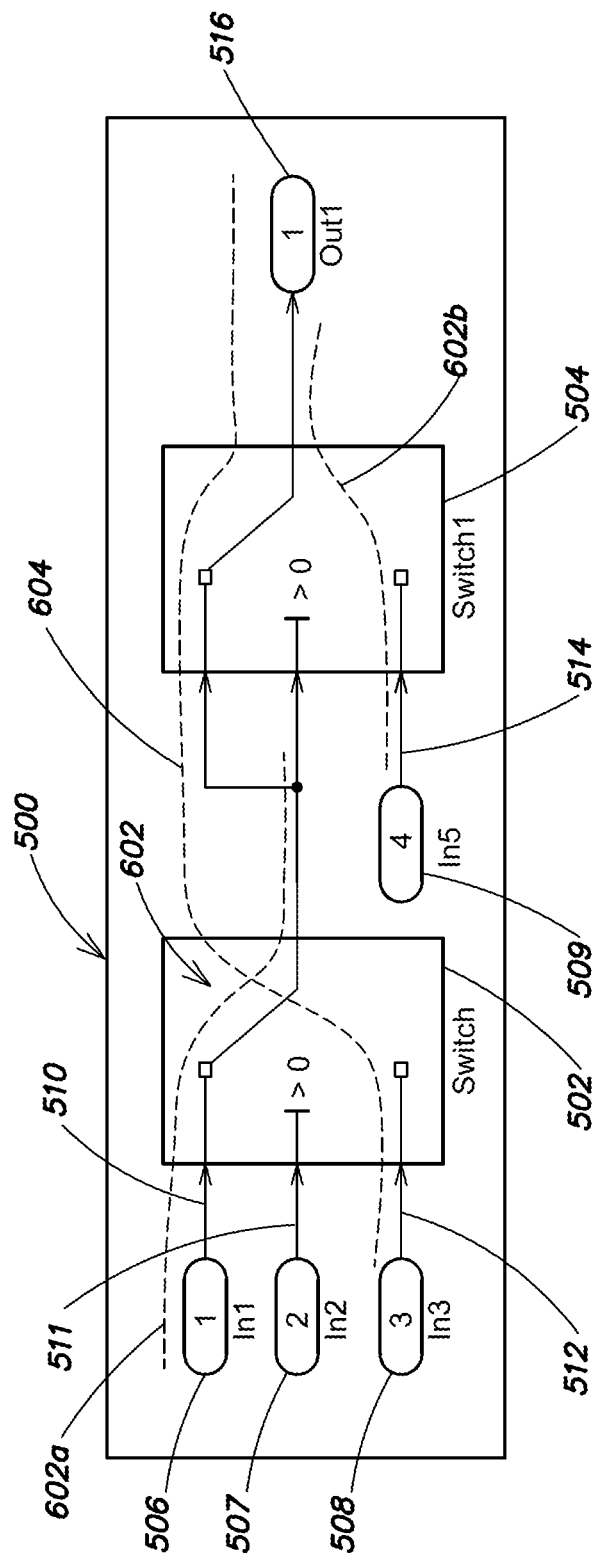
FIG. 6 is a schematic illustration of the model of FIG. 5.

The creation of composite test objectives and the test cases that evaluate them thus extends model coverage beyond that which is available with individual basic test objectives. For example, FIG. 6 is a schematic illustration of the first model 500 showing two additional pathways that may be tested as a result of the creation of composite test objectives. Specifically a first pathway 602 having portions 602a and 602b corresponds to item 2. above in which the control input to the first switch block 502 is true and the control input to the second switch block 504 is false at a given time step. In addition, a second pathway 604 corresponds to item 3. above in which the control input to the first switch block 502 is false and the control input to the second switch block 504 is true at a given time step.

Figure 7:
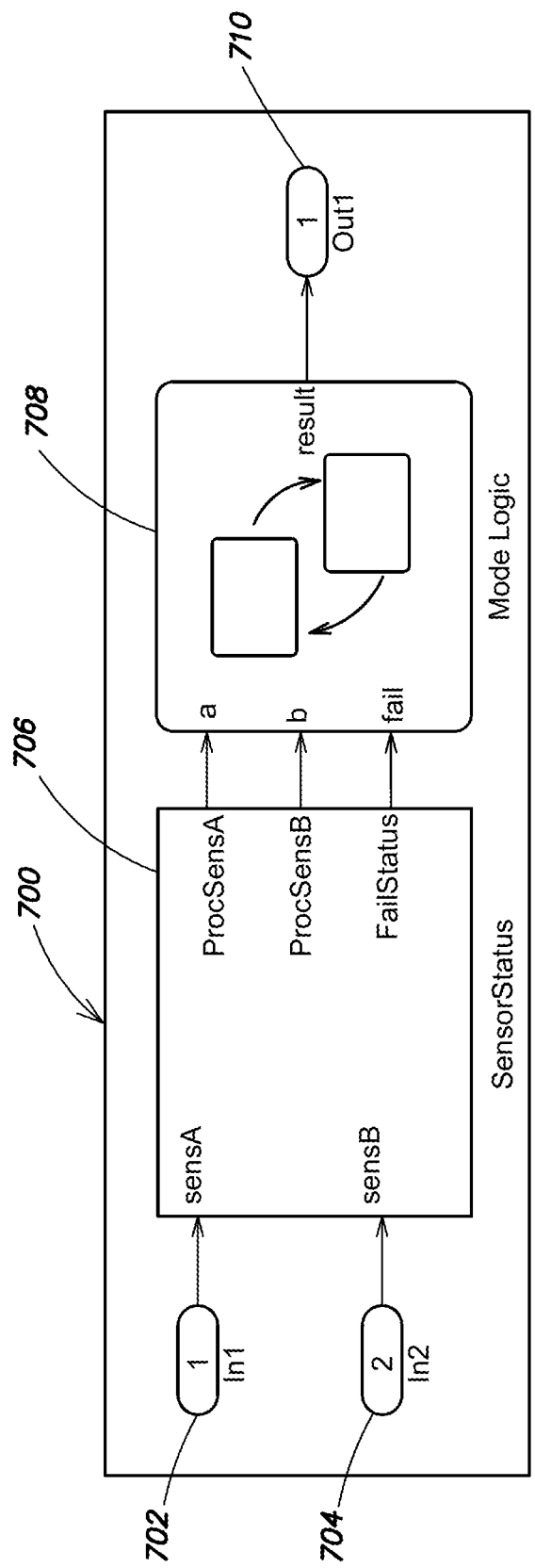
FIG. 7 is a schematic illustration of a model in accordance with an embodiment.

FIG. 7 is a schematic illustration of a second model 700. The second model 700 includes a first Inport block (In1) 702, a second Inport block (In2) 704, a subsystem (SensorStatus) 706, a state chart 708 (Mode Logic), and an Outport block (Out1) 710. The subsystem 706 receives sensor A (sensA) and sensor B (sensB) signals from the first and second Inport blocks 702 and 704. The state chart 708 receives an 'a' signal, a 'b' signal, and a 'fail' signal from the subsystem 706.

Figure 8:
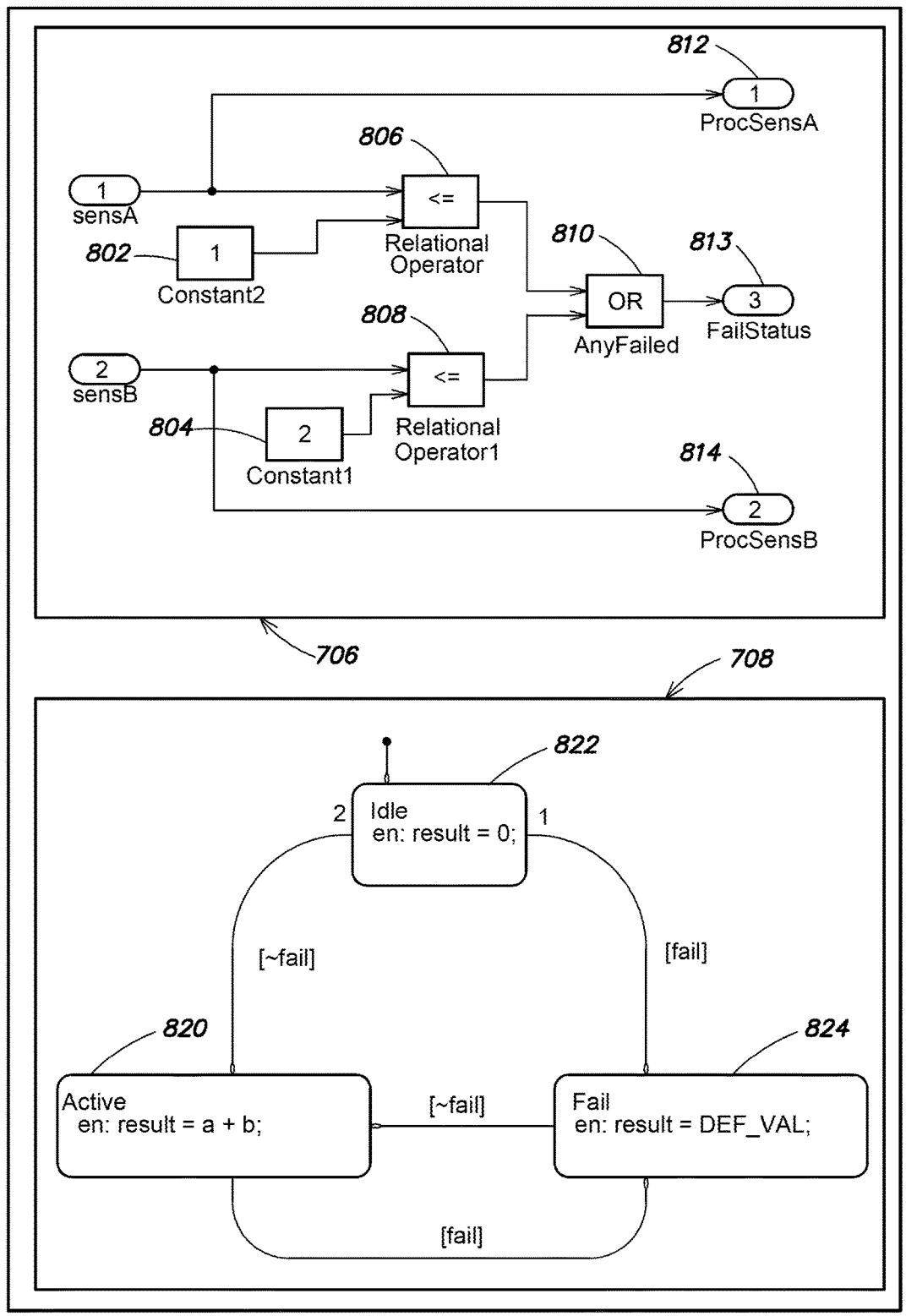
FIG. 8 is a schematic illustration of components of the model of FIG. 6 in accordance with an embodiment.

FIG. 8 is a schematic illustration of elements and components that make up the subsystem 706 and the state chart 708, which have been opened to show their structure. The subsystem 706 includes a first Constant block 802 set to '1', a second Constant block 804 set to '2', first and second Relational Operator blocks 806 and 808 configured to make a less than or equal to determination, and a logical OR block 810. The subsystem also includes first, second, and third Outport blocks 812-814 that provide the sensA signal, the sensB signal, and a fail signal, which may be true or false. The subsystem 706 is configured to test whether the signal for sensA is equal to or less than '1', and whether the signal for sensB is equal to or less than '2'. If either test is true, the subsystem 706 transitions the fail signal generated by the OR block 810 from false to true.

The state chart 708 includes an Active state 820, an Idle state 822, and a Fail state 824. The state chart 708 is configured to transition to the Fail state 824 from either the Idle state 822 or the Active state 820 when the fail signal of the subsystem 706 transitions to true. When the fail signal transitions to false, the state chart transitions to the Active state 820 from either the Idle state 822 or the Fail state 824.

The user may specify a composite test objective predicated upon basic test objectives defined for the OR block 810 of the subsystem 706 and the Idle→Fail transition of the state chart 708.

In response, the composite objective builder 124 may construct the following composite test objectives:

1. a first composite test objective where the signal from sensor A is less than or equal to 1 and the Idle→Fail transition of the state chart 708 is enabled in a given time is step;

2. a second composite test objective where the signal from sensor B is less than or equal to 2 and the Idle→Fail transition of the state chart 708 is enabled in a given time step;

3. a third composite test objective where the signal from sensor A is less than or equal to 1, the signal from sensor B is less than or equal to 2, and the Idle→Fail transition of the state chart 708 is enabled in a given time step; and 4. a fourth composite test objective where signal from sensor A is greater than 1, the signal from sensor B is greater than 2, and the Idle→Fail transition of the state chart 708 is enabled.

The test case generator 126 may determine that test cases may be constructed for composite test objectives 1, 2, and 3, and thus designate these composite test objectives as satisfiable. The test case generator 126 may also determine that it cannot construct a test case for composite test objective 4, and thus designate this composite test objective as proven unsatisfiable.

A composite test objective may be defined that combines all possible ways in which a mode transitions Idle→Fail when sensorStatus is 'failed'. Such a composite test objective may be defined textually, such as:

SensorFailedModeSpec=Compose ({AnyFailed, MCDC}, {idle→fail, Decision, true}).

where 'SensorFailedModeSpec' is a label for identifying the composite test objective being created;

'Compose' is the operation or function for creating a composite test objective predicated upon two or more basic test objectives;

'AnyFailed, MCDC' refers to the basic test objectives defined under the MCDC model coverage objective or metric for the OR block 810 of the subsystem 706;

'idle→fail, decision, true', refers to the basic test objectives defined under the Decision model coverage objective or metric for the transition from the Idle state 822 to the Failed state 824 of the state chart 708.

Hierarchy of Composite Test Objectives

In an embodiment, the model verification engine 116 may be configured to support various definitions of a composite test objective. The following is a non-exhaustive list of possible statements that provide logical combinations of basic test objectives (BTO) to form a composite test objective:

$BTO_1$ AND $BTO_2$;
$BTO_1$ AND $BTO_2$ AND $BTO_3$;
$BTO_1$ AND ($BTO_2$, $BTO_3$, OR $BTO_4$); and
($BTO_1$ OR $BTO_2$) AND ($BTO_3$ OR $BTO_4$).

Other composite test objectives include:

$BTO_1$ BEFORE $BTO_2$, in which a test case satisfies $BTO_1$ at a model or time step before the test case satisfies $BTO_2$;

$BTO_1$ FOLLOWS $BTO_2$, in which a test case satisfies $BTO_2$ at the successive, e.g., next, model or time step after the test case satisfies $BTO_1$;

$BTO_1$ EVENTUALLY $BTO_2$, in which a test case satisfies $BTO_2$ at some model or times step after the model or time step at which the test case satisfies $BTO_1$; and GLOBALLY $BTO_1$, in which a test case satisfies $BTO_1$ at every model or time step.

In addition, a composite test objective (CTO) may be predicated on one or more other composite test objectives, thereby creating a hierarchy of composite test objectives. For example, a user may specify the following composite test objectives:

$CTO_1$ AND $CTO_2$;
$CTO_1$ AND $PTO_1$;
$CTO_1$ AND ($PTO_2$, $PTO_3$, OR $PTO_4$);
$CTO_1$ BEFORE $CTO_2$;
$CTO_1$ FOLLOWS ($CTO_2$ AND $CTO_3$).

The composite objective builder 124 may be configured to apply one or more rules of precedence when evaluating a function creating a composite test objective. For example, temporal operators and parentheses may be given a highest priority.

It should be understood that a given composite test objective may be predicated upon other combinations of basic test objectives and/or composite test objectives.

Figure 9:
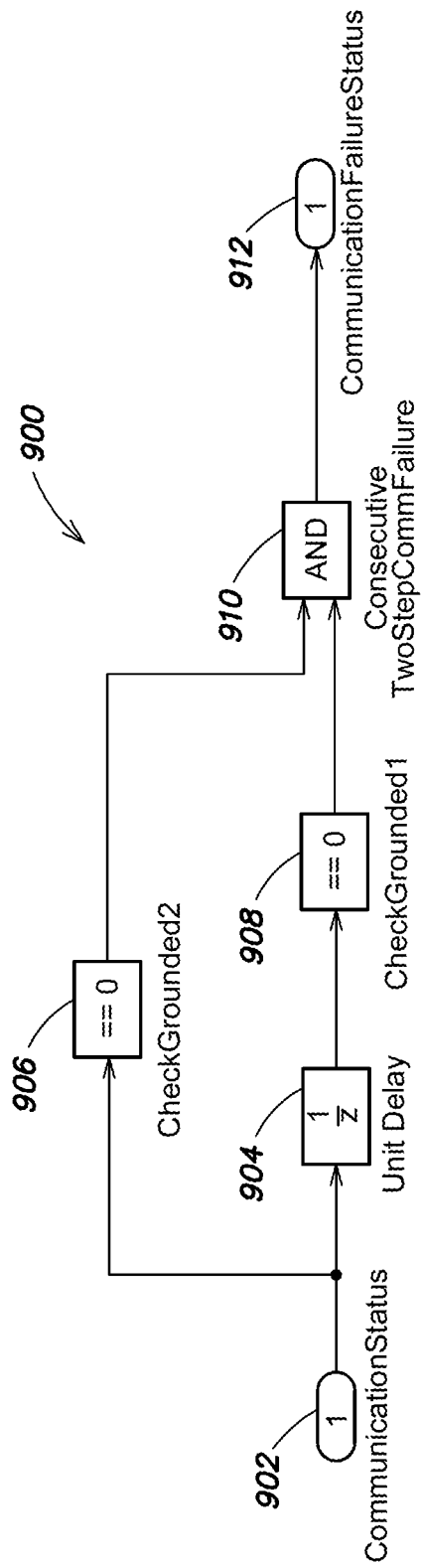
FIG. 9 is a schematic illustration of a model portion in accordance with an embodiment.

Furthermore, suppose the second model 700 (FIG. 7) includes another model portion located at a different level of the model hierarchy than the state chart 708, and that this other model portion is configured to determine whether a communication failure exists. FIG. 9 illustrates a model portion 900 that may be included in the second model 700. The model portion 900 may include an Inport block (CommunicationStatus) 902, a Unit Delay block 904, and first and second Compare to Zero blocks 906 and 908 that are configured to output True if the input signal is zero, otherwise False. The model portion 900 also may include an AND block 910, and an Outport Block (CommunicationFailureStatus) 912. The model portion 900 is configured to output a True signal when the CommunicationStatus signal is zero for two consecutive model or time steps.

Composite test objectives predicated upon both a sensor failure, as determined within the second model 700, and a communication failure, as determined within model portion 900, may be created. For example, a user may specify a composite test objective textually:

NewCompTestObj=Compose({SensorFailedModeSpec}, {ConsecutiveTwoStepCommFailed, Decision, true})

where,

'NewCompTestObj' is a label for the new composite test objective being created;

'Compose' is the operation or function;

'SensorFailedModeSpec' is the previously defined composite test objective;

'ConsecutiveTwoStepCommFailed, Decision, true' refers to the basic test objectives defined under the Decision model coverage objective or metric for the AND block 910 of the model portion 900.

Composite Test Objective Specification

In an embodiment, groups of composite test objectives 132 may be organized into composite test objective specifications. For example, a first set of composite test objectives may be organized into a first specification and a second set of composite test objectives may be organized into a second specification. The composite test objective specifications may be associated with different tests on the model 115. In particular, a first composite test objective specification may include composite test objectives for the Decision coverage metric, while a second composite test objective specification may include composite test objectives for the MC/DC coverage metric.

Automated Generation of Composite Test Objectives

In an embodiment, the composite objective builder 124 may be configured to generate one or more composite test objectives for the model 115 automatically. In particular, the model analyzer 118 may be configured to perform a dependency analysis on the model 115. Data and/or control dependencies may be identified between blocks, and between a block and a state-based portion of a model. In addition, libraries and other models may be referenced either directly or indirectly by a model.

In response to the dependency analysis, the model analyzer 118 may determine that a dependency exists between two model elements. The composite test objective builder 124 may be configured to receive the results of the dependency analysis, and to construct a composite test objective predicated upon the basic test objectives defined for these two model elements. For example, the dependency analysis may reveal that a transition between two states of a state chart occurs when the signal from a block reaches a threshold value. In addition, basic test objectives may exist for the transition and the block that generates the signal. The composite objective builder 124 may construct a composite test objective that is a logical AND of the basic test objectives for the transition and the block.

In addition, while two model elements of a model may not affect each other, the results computed of these two model elements during execution of the model may affect some other model element. Creating a composite test objective that combines the basic test objectives for the two model elements may enhance overall model coverage that may not otherwise be possible using basic test objectives.

Figure 10:
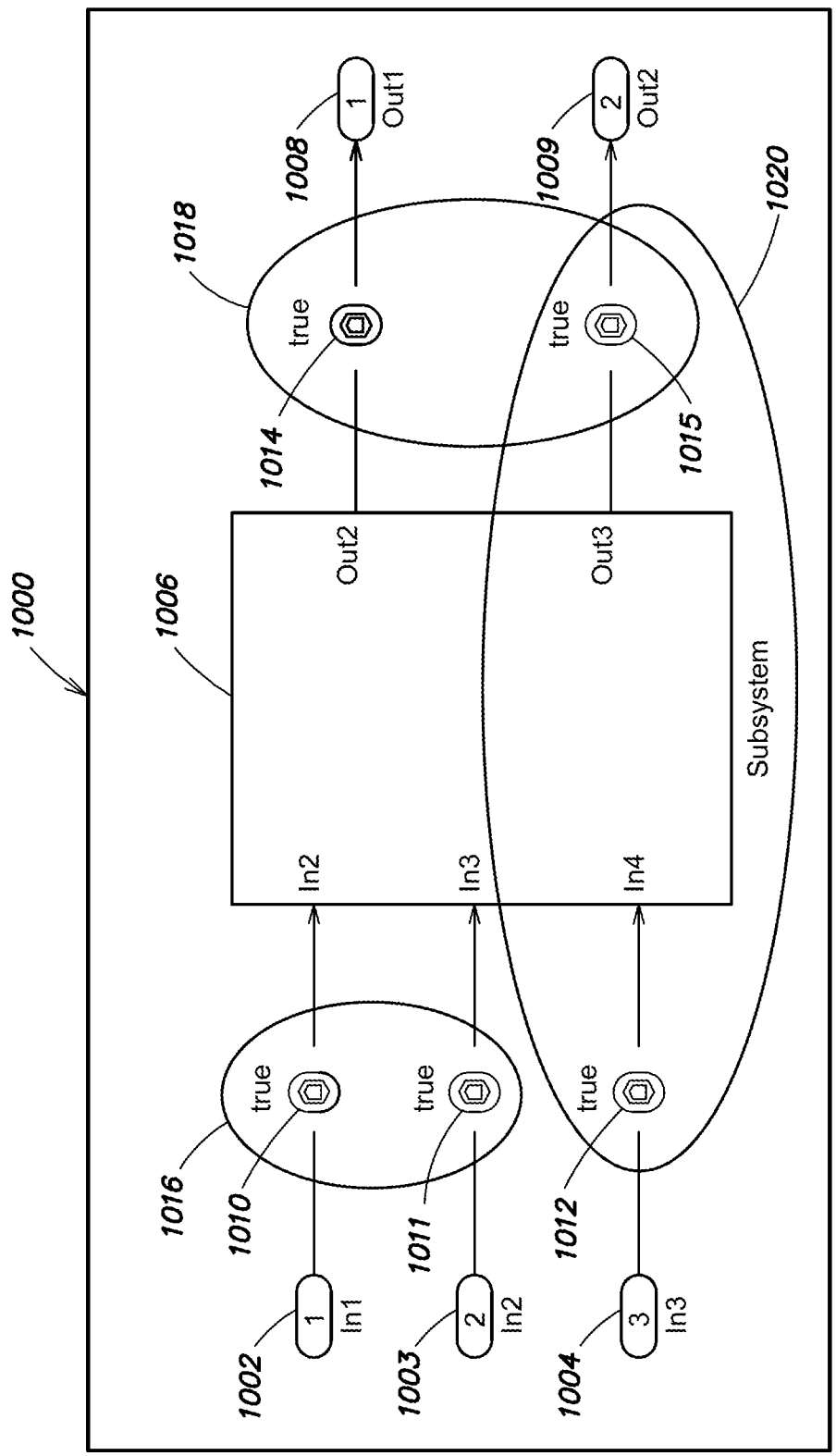
FIG. 10 is a schematic illustration of a model in accordance with an embodiment.

Composite test objectives may also be automatically constructed at the boundaries of model components. FIG. 10 is a schematic illustration of a model 1000. The model 1000 includes first, second, and third Inport blocks (In1, In2, and In3) 1002-1004, a subsystem block 1006, and two Outport blocks (Out1 and Out2) 1008 and 1009. Custom test objective blocks have also been added to the model 1000. In particular, three custom test objective blocks 1010-1012 have been added to the inputs signals to the subsystem block 1006, which signals are generated by the three Inport blocks 1002-1004. In addition, two custom test objective blocks 1014 and 1015 have been added to the output signals of the subsystem block 1006, which signals are received by the Outport blocks 1008 and 1010.

Composite test objectives may be defined based on different groupings of the custom test objectives. For example, a first composite test objective, as illustrated by first oval 1016, may be predicated upon the first custom test objective 1010 AND the second custom test objective 1011, at the inputs to the subsystem block 1006. A second composite test objective, as illustrated by second oval 1018, may be predicated upon the fourth custom test objective 1014 AND the fifth custom test objective 1015, at the outputs of the subsystem block 1006. A third composite test objective, as illustrated by third oval 1020, may be predicated upon the third custom test objective 1012 and the fourth custom test objectives 1014, at the input and output of the subsystem block 1006.

Observation/Verification Conditions/Points

In an embodiment, custom-defined basic test objectives may also be specified for a model without adding new elements to the model, for example without adding custom objective blocks or custom constraint blocks to the model. The user interface engine 102 may be configured to generate a present a graphical affordance, such as a verification interface, e.g., on a display to a user. A user may specify custom-defined basic test objectives as well as composite test objectives through the verification interface.

Figure 11:
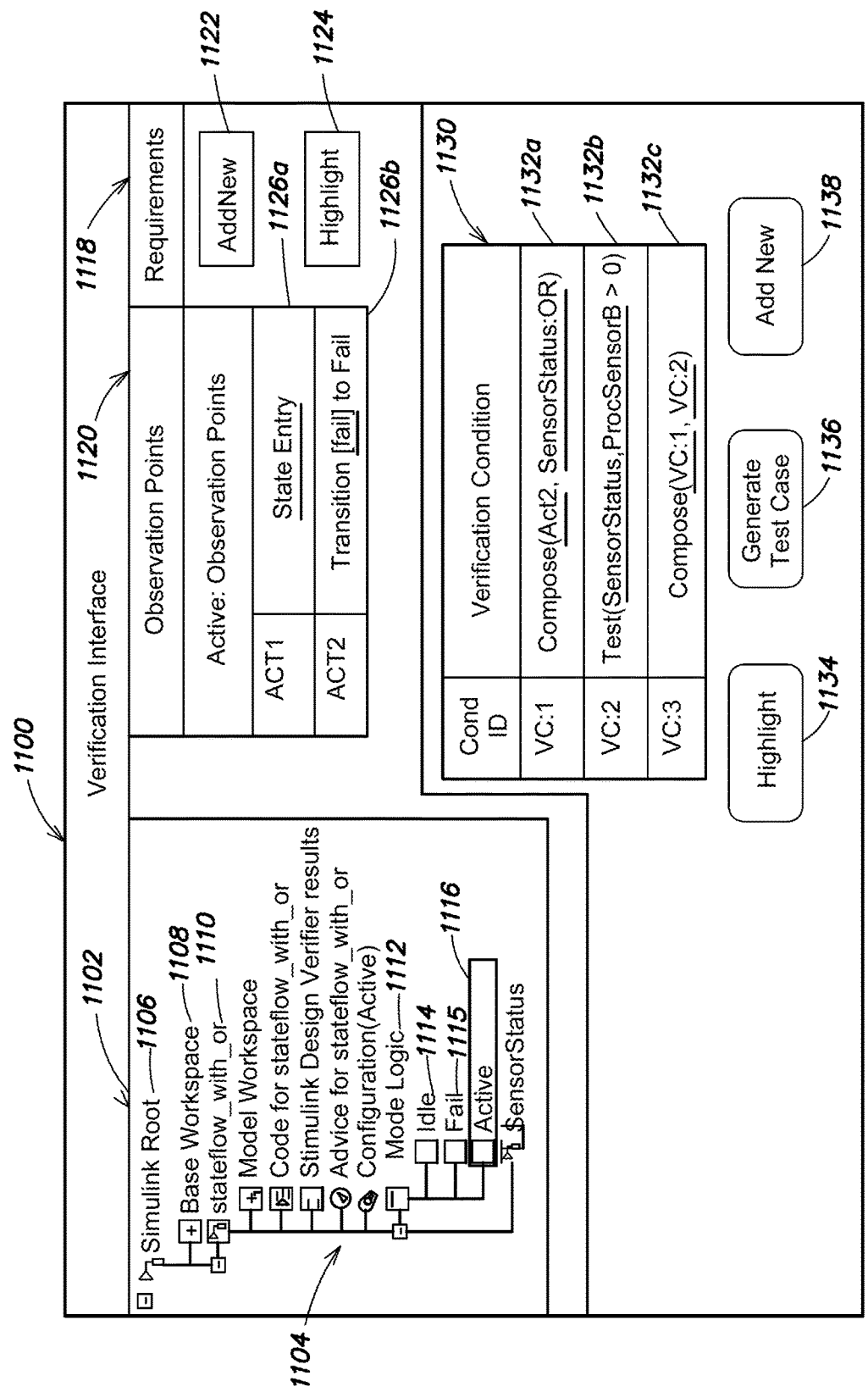
FIG. 11 is a schematic illustration of a verification interface in accordance with an embodiment.

FIG. 11 is a schematic illustration of a verification interface 1100 in accordance with an embodiment. The verification interface 1100 may include a model hierarchy pane 1102. The model hierarchy pane 1102 may display a tree-structured view 1104 of the hierarchy of the currently active, e.g., currently open, model. The tree-structured view 1104 may include a plurality of nodes that correspond to various parts of a model. The nodes may be arranged to reflect the hierarchy of the model, and at least some of the nodes may be expanded to show lower level nodes that represent other parts of the model at lower hierarchical levels. At the top, the tree-structured view 1104 may include a model root node 1106. Below the model root node 1106, the tree-structured view 1104 may include a base workspace node 1108, and nodes for the sub-models, state charts, and subsystems included in the model, such as a stateflow_with_or node 1110 for a state chart. Below the stateflow_with_or node 1110 may be nodes for parts of the state chart, including a mode logic node 1112 that represents a state chart designed to monitor the status of at least some of the states defined within the state chart. In particular, the mode logic state chart monitors the status of an idle state, a fail state, and an active state, for which corresponding nodes 1114-1116 are included in the tree-structured view 1104.

Instead of adding new elements, such as blocks, to a model in order to conduct verification testing, a user may specify one or more observation points through the verification interface 1100. A user may select a node of the tree-structured view 1104 to specify an observation point for the portion of the model corresponding to the selected node. Suppose, for example, that the user selects the active node 1116, as shown. The verification interface 1100 may further include an observation point pane 1118 through which the user may specify one or more observation points for the respective portion of the model as selected in the tree-structure view 1104, namely, the active state of the mode logic state chart. The observation point pane 1116 may include a table 1120 having entries for the observation points that have been defined, and an Add New command button 1122 that may be used to specify a new observation point. The observation point pane 1118 may also include a Highlight command button 1124 that, if selected, highlights within the model one or more of the observation points presented in the observation point pane 1118, e.g., for ease of navigation. As illustrated, the observation point pane 1118 has two entries for the active state: a first entry 1126a that specifies a state entry observation point, and a second entry 1126b that specifies a transition to the fail state observation point.

The verification interface 1100 also may include a verification condition pane 1130 through which a user may specify one or more verification conditions for the model. The verification condition pane 1130 may include one or more entries 1132 that correspond to particular verification conditions specified for the model. A first entry 1132a specifies a composite test objective, named VC:1, predicated upon a logical combination of the second observation point and an OR block located within a 'SensorStatus' subsystem of the model. A second entry 1132b specifies, in a textual format, a custom-defined basic test objective, named VC:2, which tests whether the 'ProcSensorB' output signal of the 'SensorStatus' subsystem is greater than zero. A third entry 1132c specifies a composite test objective, named VC:3, that is predicated upon the first two verification conditions. The verification condition pane 1130 may also include a highlight command button 1134, a generate test case command button 1136, and an add new command button 1138. Selection of the highlight command button 1134 may cause one or more of the verification conditions to be highlighted in the model. Selection of the generate test case command button 1136 may cause the test case generator 126 to create test cases for one or more of the verification conditions. To specify a new verification condition, a user may select the add new command button 1138.

In an embodiment, the observation points and the verification conditions may be stored as meta data with the model.

The verification interface 1100 provides a graphical affordance through which a user may write, browse, organize, and manage basic test objectives and composite test objectives.

Illustrative Data Processing System

Figure 12:
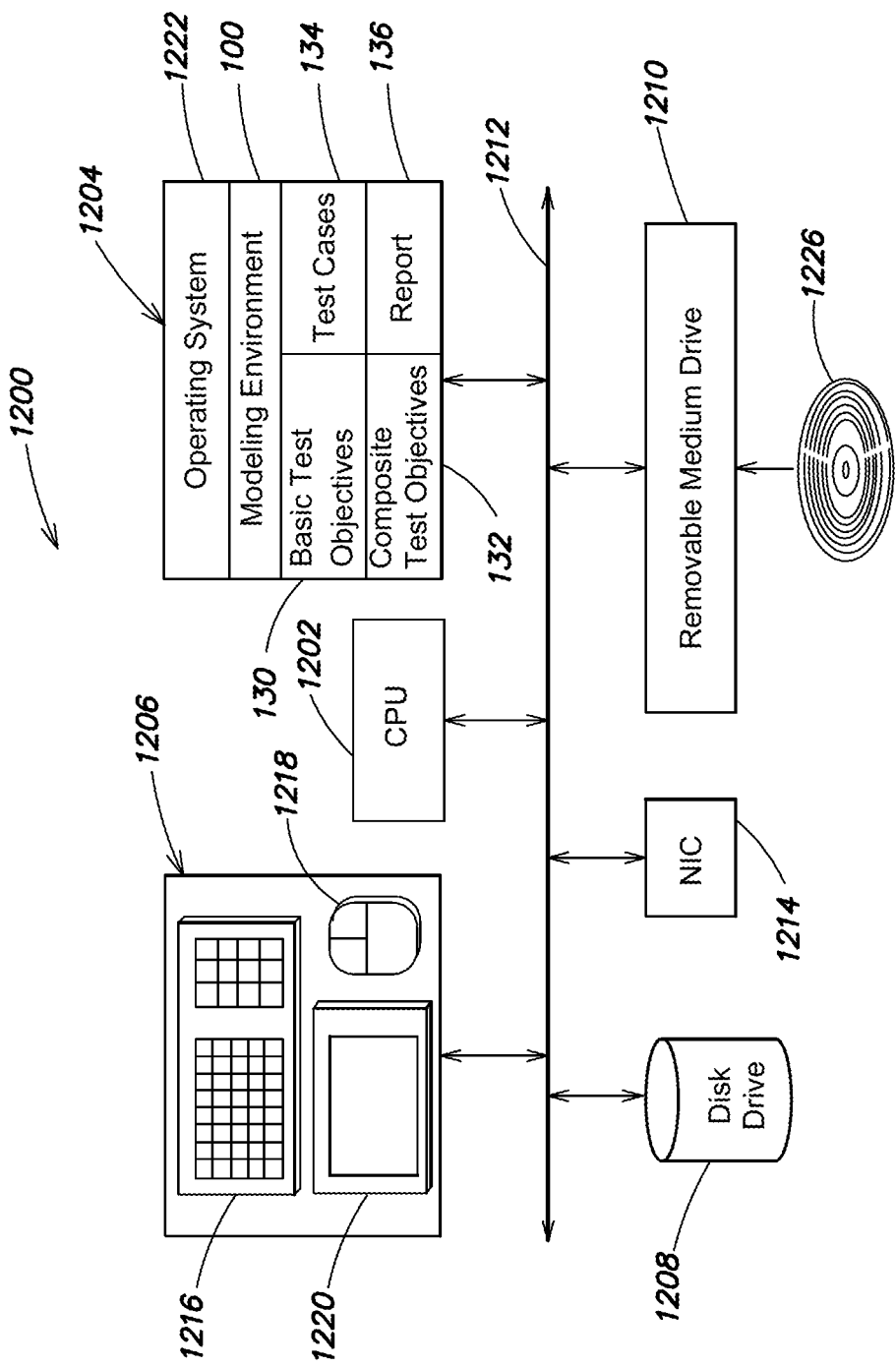
FIG. 12 is a schematic illustration of a data processing system in accordance with an embodiment.

FIG. 12 is a schematic illustration of a computer or data processing system 1200 for implementing an embodiment of the invention. The computer system 1200 may include one or more processing elements, such as a processing element 1202, a main memory 1204, user input/output (I/O) 1206, a persistent data storage unit, such as a disk drive 1208, and a removable medium drive 1210 that are interconnected by a system bus 1212. The computer system 1200 may also include a communication unit, such as a network interface card (NIC) 1214. The user I/O 1206 may include a keyboard 1216, a pointing device, such as a mouse 1218, and a display 1220. Other user I/O 1206 components include voice or speech command systems, other pointing devices include touchpads and touchscreens, and other output devices besides a display, include a printer, a projector, a touchscreen, etc. Exemplary processing elements include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 1204, which may be a Random Access Memory (RAM), may store a plurality of program libraries or modules, such as an operating system 1222, and one or more application programs that interface to the operating system 1222, such as the modeling environment 100. One or more objects or data structures may also be stored in the main memory 1204, such as the basic test objectives 130, the composite test objectives 132, the test cases 134, and the report 136, among other data structures.

The removable medium drive 1210 may accept and read a computer readable medium 1226, such as a CD, DVD, floppy disk, solid state drive, tape, flash memory or other non-transitory medium. The removable medium drive 1210 may also write to the computer readable medium 1226.

Suitable computer systems include personal computers (PCs), workstations, servers, laptops, tablets, palm computers, smart phones, electronic readers, and other portable computing devices, etc. Nonetheless, those skilled in the art will understand that the computer system 1200 of FIG. 12 is intended for illustrative purposes only, and that the present invention may be used with other computer systems, data processing systems, or computational devices. The present invention may also be used in a networked, e.g., client-server, computer architecture, or a public and/or private cloud computing arrangement. For example, the modeling environment 100 may be hosted on a server, and accessed by a remote client through an application hosting system, such as the Remote Desktop Connection tool from Microsoft Corp.

Suitable operating systems 1222 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 1222 may provide services or functions for other modules, such as allocating memory, organizing data according to a file system, prioritizing requests, etc. The operating system 1222 may run on a virtual machine, which may be provided by the data processing system 1200.

As indicated above, a user or developer, such as an engineer, scientist, programmer, etc., may utilize one or more input devices, such as the keyboard 1216, the mouse 1218, and the display 1220 to operate the modeling environment 100, and construct one or more models. As discussed, the models may be computational and may have executable semantics. In particular, the models may be simulated or run. In particular, the models may provide one or more of time-based, event-based, state-based, message-based, frequency-based, control-flow based, and dataflow-based execution semantics. The execution of a model may simulate operation of the system that is being designed or evaluated. The term graphical model is intended to include graphical program.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system (e.g., system 100) or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 1200. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. For example, one or more message-based blocks, such as a verification block, may be configured through a command line Application Programming Interface (API) that may be provided by the message-based object constructor or the verification engine. Therefore, it is the object of the appended claims to cover all such variations and modifications as come within the true spirit and scope of the disclosure.

What is claimed is:

1. A method comprising:
   for an executable model having
      a plurality of inputs, and
      a plurality of model objects configured to compute values for variables during execution of the executable model;
   obtaining a plurality of test objectives for the executable model, the plurality of test objectives
      specifying particular values for at least some of the variables;
   creating, by a processor, a composite test objective utilizing at least two of the plurality of test objectives, wherein the composite test objective comprises at least one of
      a logical combination of the at least two of the plurality of test objectives, or
      a temporal association of the at least two of the plurality of test objectives,
      wherein the composite test objective examines at least one pathway through the executable model not examined by the at least two of the plurality of test objectives; and
   invoking test generation to produce at least one test case that
      specifies one or more input values for one or more of the plurality of inputs of the executable model, wherein the one or more input values cause the composite test objective to be satisfied during model execution.

2. The method of claim 1 wherein the executable model defines a structure, the method further comprising:
   analyzing the structure of the executable model; and
   generating a first set of the plurality of test objectives in response to the analyzing.

3. The method of claim 2 wherein the analyzing and the generating are performed automatically.

4. The method of claim 1 wherein
at least one of the plurality of test objectives is a custom test objective configured to check a requirement of the executable model.

5. The method of claim 1 wherein one or more of the plurality of test objectives are configured to
evaluate the executable model for a model coverage objective, or
detect one or more design errors in the executable model.

6. The method of claim 1 wherein the composite test objective is specified textually.

7. The method of claim 1 wherein the composite test objective is specified graphically.

8. The method of claim 1 wherein the logical combination is based on at least one of:
a Boolean AND operation;
a Boolean OR operation,
a Boolean NOT operation, or
a Boolean XOR operation.

9. The method of claim 1 wherein the temporal association is based on at least one of:
a BEFORE operation;
an AFTER operation;
an ALWAYS operation;
an EVENTUALLY operation; or
a FOLLOWS operation.

10. The method of claim 1 wherein the composite test objective is satisfied when
the executable model is simulated over a plurality of first time steps and the at least one test case causes the logical combination of the at least two of the plurality of test objectives of the composite test objective to evaluate as true during one of the plurality of first time steps, or
the executable model is simulated over a plurality of second time steps and the at least one test case causes the temporal association of the at least two of the plurality of test objectives of the composite test objective to evaluate as true during one of the plurality of second time steps.

11. The method of claim 1 wherein the executable model represents a dynamic system, and the variables include time varying signals.

12. The method of claim 1 further comprising:
executing the executable model utilizing the at least one test case.

13. The method of claim 1 wherein the obtaining includes:
receiving a testing criteria for the executable model; and
deriving one or more of the plurality of test objectives based on the testing criteria.

14. The method of claim 1 further comprising:
performing a dependency analysis on the executable model to identify a dependency between at least two model objects of the plurality of model objects of the executable model, wherein
the creating the composite test objective is based on the dependency analysis, wherein the at least two of the plurality of test objectives are associated with the at least two model objects.

15. The method of claim 1 further comprising:
receiving a designation of the composite test objective.

16. The method of claim 15 further comprising:
generating a user interface; and
displaying the user interface on a display device, wherein the designation of the composite objective is received through the user interface.

17. The method of claim 1 wherein the at least one test case satisfies the composite test objective when the at least one of the logical combination of the at least two of the plurality of test objectives is satisfied or the temporal association of the at least two of the plurality of test objectives is satisfied.

18. The method of claim 1 wherein one or more of the plurality of test objectives are configured to evaluate the executable model for a model coverage objective that includes one or more of
condition coverage,
decision coverage,
modified condition/decision coverage (MC/DC),
lookup table,
signal range,
signal size, or
cyclomatic complexity.

19. The method of claim 1 wherein the variables include one or more of:
control signals,
data signals,
states,
state transitions, or
parameters.

20. One or more non-transitory computer-readable media comprising program instructions, the program instructions when executed by a processor operable to:
for an executable model having
a plurality of inputs, and
a plurality of model objects configured to compute values for variables during execution of the executable model;
obtain a plurality of test objectives for the executable model, the plurality of test objectives
specifying particular values for at least some of the variables;
create a composite test objective utilizing at least two of the plurality of test objectives, wherein the composite test objective comprises at least one of
a logical combination of the at least two of the plurality of test objectives, or
a temporal association of the at least two of the plurality of test objectives,
wherein the composite test objective examines at least one pathway through the executable model not examined by the at least two of the plurality of test objectives; and
invoke test generation to produce at least one test case that specifies one or more input values for one or more of the plurality of inputs of the executable model, wherein the one or more input values cause the composite test objective to be satisfied during model execution.

21. The one or more non-transitory computer-readable media of claim 20 further comprising program instructions to:
generate a report that indicates a degree of coverage achieved by the at least one test case.

22. The one or more non-transitory computer-readable media of claim 20 further comprising program instructions to:
receive, through an input device coupled to the processor, a designation of the at least two of the plurality of test objectives used to create the composite test objective.

23. The one or more non-transitory computer-readable media of claim 20 wherein at least one of the plurality of test objectives is a custom test objective configured to check a requirement of the executable model.

24. The one or more non-transitory computer-readable media of claim 20 wherein one or more of the plurality of test objectives are configured to
evaluate the executable model for a model coverage objective, or
detect one or more design errors in the executable model.

25. The one or more non-transitory computer-readable media of claim 20 wherein the at least one test case satisfies the composite test objective when the at least one of the logical combination of the at least two of the plurality of test objectives is satisfied or the temporal association of the at least two of the plurality of test objectives is satisfied.

26. The one or more non-transitory computer-readable media of claim 20 wherein the variables include one or more of:
control signals,
data signals,
states,
state transitions, or
parameters.

27. An apparatus comprising:
a memory configured to store an executable model having
a plurality of inputs, and
a plurality of model objects configured to compute values for variables during execution of the executable model; and
a processor coupled to the memory, the processor configured to:
obtain a plurality of test objectives for the executable model, the plurality of test objectives
specifying particular values for at least some of the variables;
create a first composite test objective utilizing at least two of the plurality of test objectives, wherein the first composite test objective comprises at least one of a
logical combination of the at least two of the plurality of test objectives, or
a temporal association of the at least two of the plurality of test objectives,
wherein the first composite test objective examines at least one pathway through the executable model not examined by the at least two of the plurality of test objectives; and
invoke test generation to produce at least one test case that
specifies one or more input values for one or more of the plurality of inputs of the executable model, wherein the one or more input values cause the first composite test objective to be satisfied during model execution.

28. The apparatus of claim 27 wherein the processor is further configured to:
create a second composite test objective that comprises at least one of
a logical combination of the first composite test objective and at least one of the plurality of test objectives, or
a temporal association of the first composite test objective and the at least one of the plurality of test objectives; and
generate, automatically, a test case for the second composite test objective to be satisfied.

29. The apparatus of claim 28 where the logical combination of the first composite test objective and the at least one of the plurality of test objectives is based on at least one of:
a Boolean AND operation;
a Boolean OR operation,
a Boolean NOT operation, or
a Boolean XOR operation.

30. The apparatus of claim 27 wherein
at least one of the plurality of test objectives is a custom test objective configured to check a requirement of the executable model.

31. The apparatus of claim 27 wherein one or more of the plurality of test objectives are configured to
evaluate the executable model for a model coverage objective, or
detect one or more design errors in the executable model.

32. The apparatus of claim 27 wherein the at least one test case satisfies the first composite test objective when the at least one of the logical combination of the at least two of the plurality of test objectives is satisfied or the temporal association of the at least two of the plurality of test objectives is satisfied.

33. An apparatus comprising:
one or more memories storing an executable model having
a plurality of inputs, and
a plurality of model objects configured to compute values for variables during execution of the executable model; and
one or more processors coupled to the one or more memories, the one or more processors configured to:
obtain a plurality of test objectives for the executable model, the plurality of test objectives specifying particular values for at least some of the variables;
create a composite test objective utilizing at least two of the plurality of test objectives, wherein the composite test objective comprises at least one of
a logical combination of the at least two of the plurality of test objectives, or
a temporal association of the at least two of the plurality of test objectives,
wherein the composite test objective examines at least one pathway through the executable model not examined by the at least two of the plurality of test objectives; and
invoke test generation to produce at least one test case that specifies one or more input values for one or more of the plurality of inputs of the executable model, wherein the one or more input values cause the composite test objective to be satisfied during model execution.

* * * * *